United States Patent
Seo et al.

(10) Patent No.: US 8,466,531 B2
(45) Date of Patent: Jun. 18, 2013

(54) IMAGING DEVICE PACKAGE, METHOD OF MANUFACTURING THE IMAGING DEVICE PACKAGE, AND ELECTRONIC APPARATUS

(75) Inventors: Ryotaro Seo, Aichi (JP); Tohru Itoh, Aichi (JP); Yukihiko Tsukuda, Aichi (JP); Tomoyasu Yamada, Aichi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/317,369

(22) Filed: Oct. 17, 2011

(65) Prior Publication Data

US 2012/0104536 A1 May 3, 2012

(30) Foreign Application Priority Data

Oct. 28, 2010 (JP) .................. 2010-241821

(51) Int. Cl.
*H01L 31/0232* (2006.01)
*H01L 21/00* (2006.01)
(52) U.S. Cl.
USPC ..................... 257/432; 257/E31.124; 438/64
(58) Field of Classification Search
CPC .......... H01L 27/14627; H01L 27/14685; H01L 27/14618; H01L 31/0232
USPC .................. 257/432, 459, E31.124; 438/57, 438/64, 63
See application file for complete search history.

(56) References Cited

U.S. PATENT DOCUMENTS

2010/0244166 A1* 9/2010 Shibuta et al. ................ 257/432

FOREIGN PATENT DOCUMENTS

| JP | 2008-211451 | | 9/2008 |
| JP | 2009-083658 | * | 3/2009 |

* cited by examiner

*Primary Examiner* — Nikolay Yushin
(74) *Attorney, Agent, or Firm* — Rader, Fishman & Grauer PLLC

(57) ABSTRACT

An imaging device package includes: an imaging device chip; a substrate on which the imaging device chip is mounted; a wire that electrically connects the imaging device chip and the substrate at a peripheral edge of the substrate around the imaging device chip; a supporting body that supports an optical member with respect to the substrate; and a bonding section that bonds the supporting body to the substrate while sealing the wire and a bonding terminal of the wire at the peripheral edge of the substrate.

12 Claims, 20 Drawing Sheets

CROSS-SECTIONAL SURFACE OF SECOND DIRECTION (VERTICAL DIRECTION)

CROSS-SECTIONAL SURFACE OF FIRST DIRECTION (HORIZONTAL DIRECTION)

CROSS-SECTIONAL SURFACE OF FIRST DIRECTION (HORIZONTAL DIRECTION)

A: WIRE BONDING AREA
B: BONDING AREA OF LENS BARREL 22

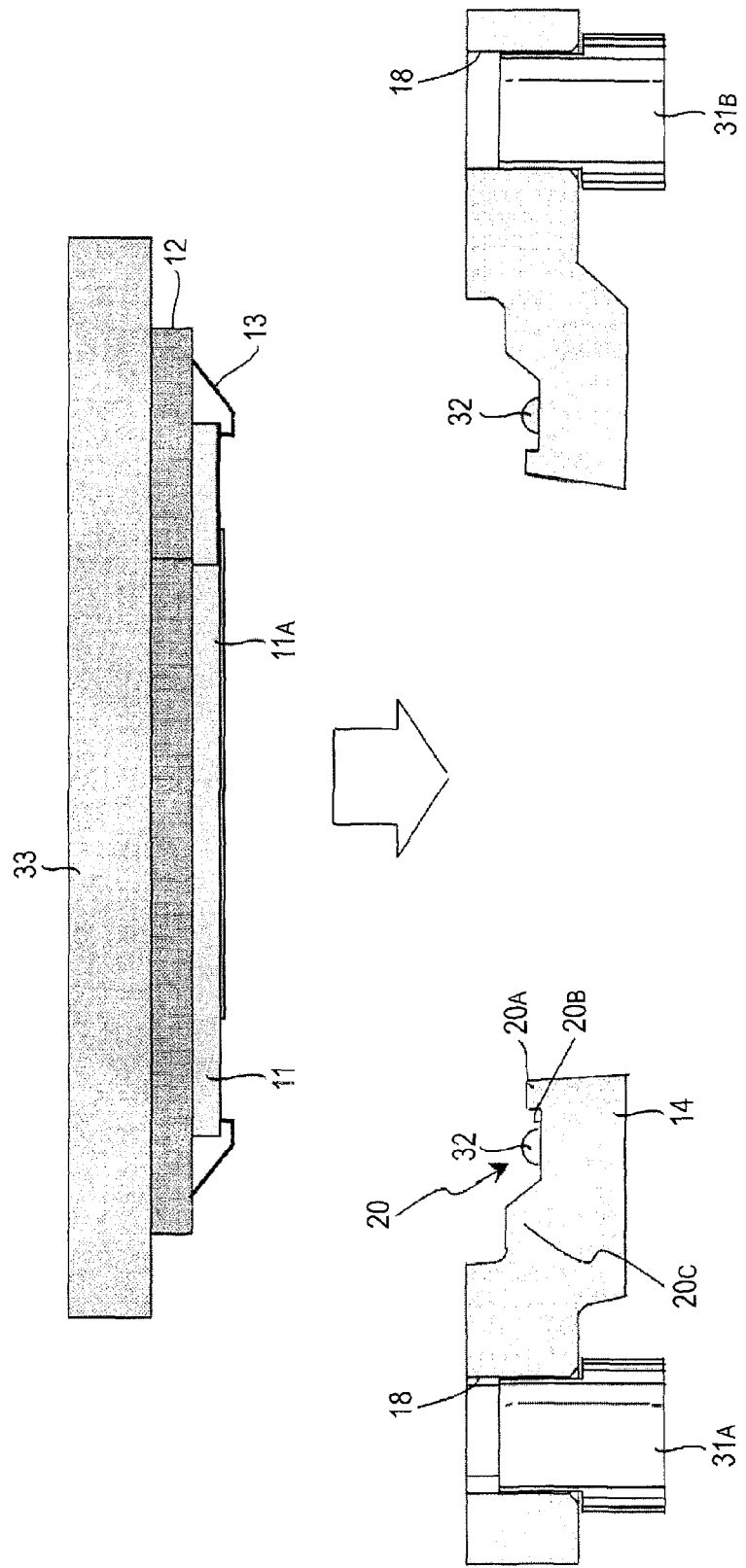

OPTIMUM CASE
$W_1 \fallingdotseq W_2 \times 0.3 \sim 0.8$

TRACK OF EJECTION NOZZLE

START POINT AND END POINT ARE TOO CLOSE

START POINT AND END POINT ARE TOO FAR APART

TOP VIEW (END POINT SIDE) (START POINT SIDE)

SIDE VIEW

A: WIRE BONDING AREA
B: BONDING AREA OF SUPPORTING BODY 104

IMAGING DEVICE PACKAGE, METHOD OF MANUFACTURING THE IMAGING DEVICE PACKAGE, AND ELECTRONIC APPARATUS

FIELD

The present disclosure relates to an imaging device package, a method of manufacturing the imaging device package, and an electronic apparatus.

BACKGROUND

The imaging device package has a package structure in which an imaging device chip is mounted on a substrate and an optical member such as seal glass is supported by a supporting body fixed in a substrate peripheral section around the imaging device chip by an adhesive. This package structure is more specifically explained with reference to FIG. 20.

In FIG. 20, an imaging device chip 101 is mounted on a substrate 102 with an imaging surface $101_A$ set on an upper side and is electrically connected to the substrate 102 by a wire (a bonding wire/a gold wire) 103. A supporting body 104 is attached to the outer edge of the substrate 102 by a bonding section 105 including an adhesive. The supporting body 104 supports an optical member 106 having optical transparency such as seal glass with respect to the substrate 102.

In the past, an imaging device package 100 of this type adopts a configuration in which a bonding area A for the wire 103 is provided around the imaging device chip 101 on the substrate 102 and a bonding area B for fixing the supporting body 104 is provided on the outer side of the area A (see, for example, JP-A-2008-211451).

SUMMARY

As explained above, in the case of the structure in which the wire bonding area A is provided in the outer peripheral section of the substrate 102 and the bonding area B for the supporting body 104 is provide on the outer side of the wire bonding area A, it is necessary to secure a large area as a substrate peripheral edge around the imaging device chip 101. Therefore, it is difficult to reduce the size of the package. Since the wire 103 is uncovered on the inside of the imaging device package 100, when moisture intrudes into the inside of the package, a joined section of the wire 103 could corrode. This leads to deterioration in reliability (deterioration in quality) of a wire connecting section.

Therefore, it is desirable to provide an imaging device package, a method of manufacturing the imaging device package, and an electronic apparatus that can realize a reduction in the size of a package and improvement of reliability (improvement of quality) of a wire connecting section.

An embodiment of the present disclosure is directed to an imaging device package including: an imaging device chip; a substrate on which the imaging device chip is mounted; a wire that electrically connects the imaging device chip and the substrate at a peripheral edge of the substrate around the imaging device chip; and a supporting body that supports an optical member with respect to the substrate, wherein the supporting body is bonded to the substrate with the wire and a bonding terminal of the wire sealed by a bonding section at the peripheral edge of the substrate.

In the imaging device package having the configuration explained above, the bonding section for bonding the supporting body to the substrate seals the wire and the bonding terminal of the wire. This means that the bonding section is provided making use of a wire bonding area. Since the wire bonding area is used as a bonding area for the supporting body, it is unnecessary to separately secure the bonding area. Moreover, since the wire and the bonding terminal of the wire are sealed by the bonding section, intrusion of moisture into a wire connecting section can be prevented.

According to the embodiment of the present disclosure, since it is unnecessary to separately secure the bonding area for the supporting body, it is possible to realize a reduction in the size of the package. Further, since intrusion of moisture into the wire connecting section can be prevented, it is possible to realize improvement of reliability (improvement of quality) of the wire connecting section.

BRIEF DESCRIPTION OF THE DRAWINGS

FIG. 5 is an explanatory diagram concerning a method of manufacturing an imaging device package according to an embodiment of the present disclosure;

DETAILED DESCRIPTION

Modes for carrying out the present disclosure (hereinafter referred to as "embodiments") are explained in detail below with reference to the drawings. The explanation is made in order described below.

1. First embodiment (a type in which a lens unit is attached using optical reference planes as seating surfaces)
2. Second embodiment (a type in which a lens barrel is directly mounted)
3. Method of manufacturing an imaging device package
3-1. Concerning an uneven structure of a supporting body
3-2. Concerning a discharge structure for gas entrapped during bonding
4. Electronic apparatus (imaging apparatus)

1. First Embodiment

Figure 1:
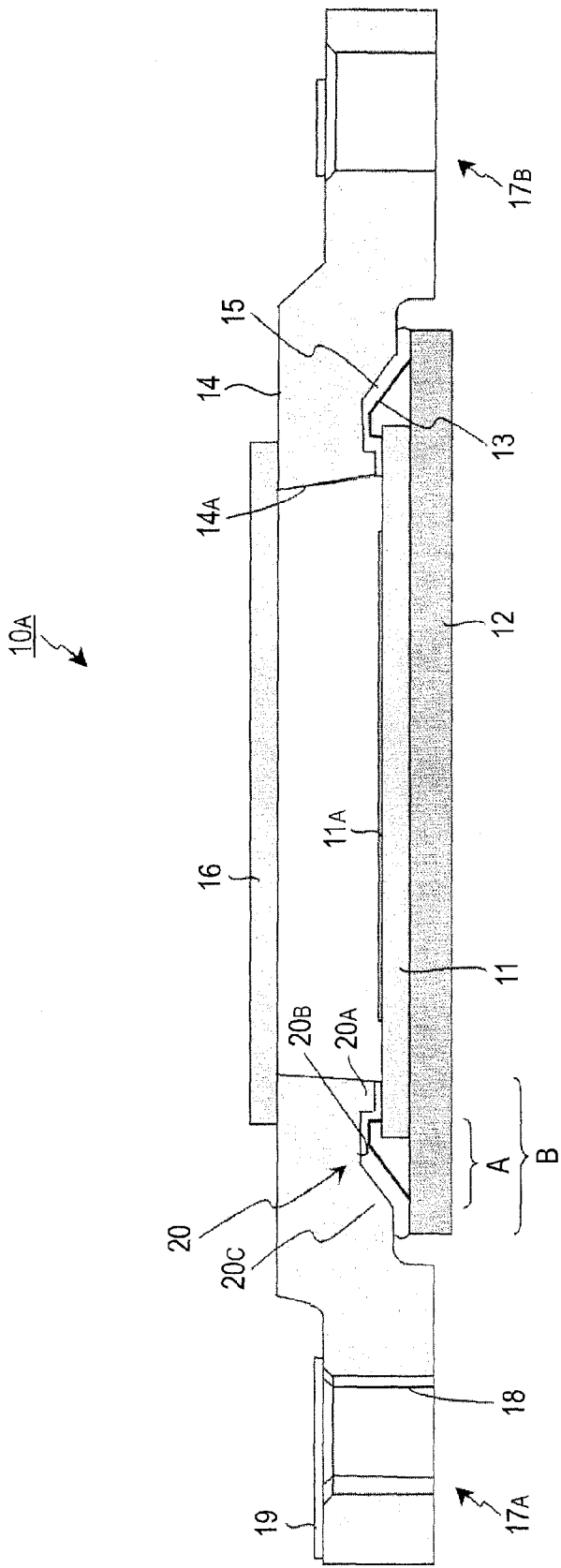
FIG. 1 is a sectional view showing a sectional structure along a first direction of an imaging device package according to a first embodiment of the present disclosure.
Figure 2:
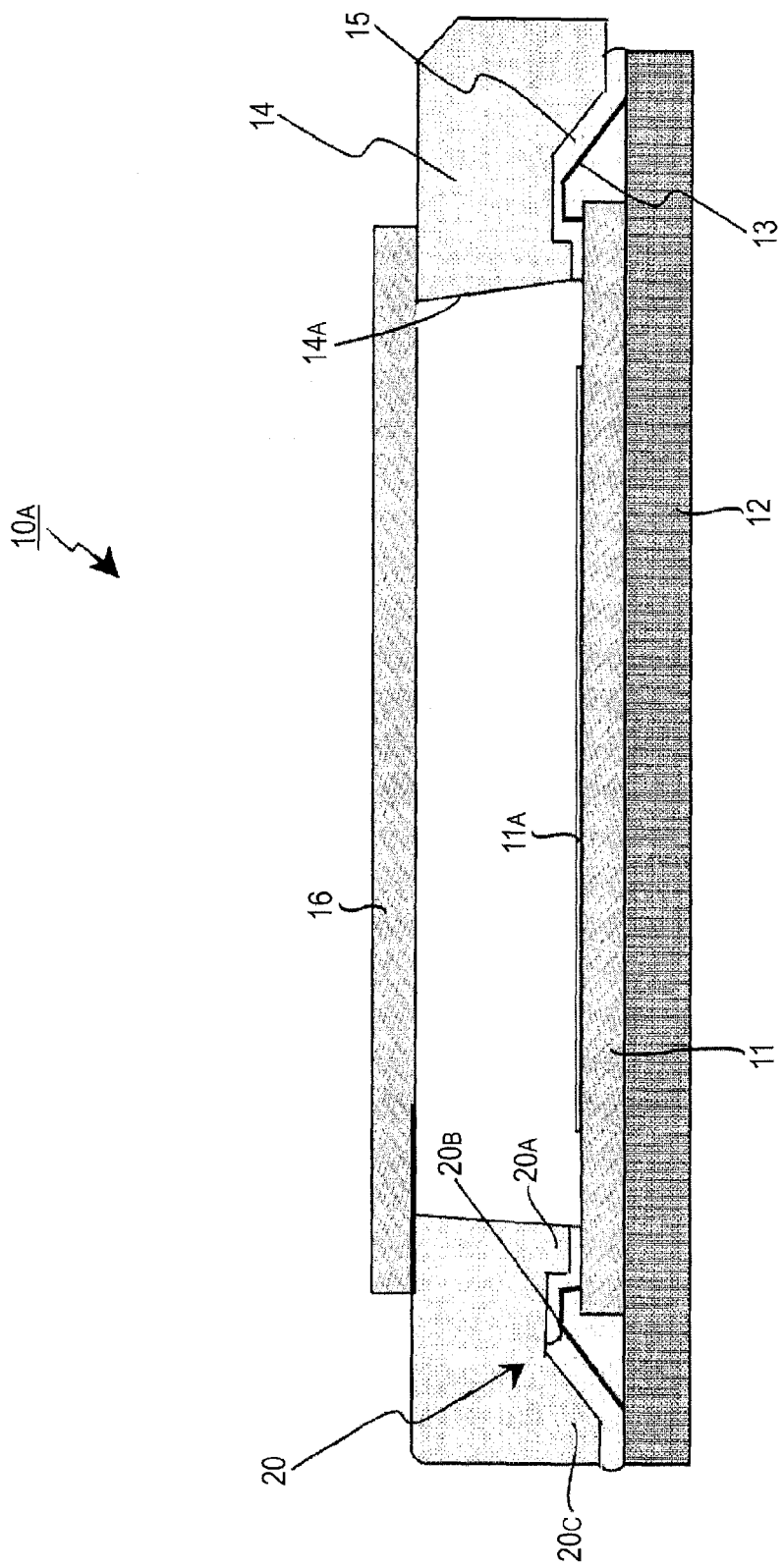
FIG. 2 is a sectional view showing a sectional structure along a second direction of the imaging device package according to the first embodiment.

FIG. 1 is a sectional view showing a sectional structure along a first direction of an imaging device package according to a first embodiment of the present disclosure. FIG. 2 is a sectional view showing a sectional structure along a second direction orthogonal to the first direction. The first direction refers to an array direction of pixels in a pixel row in a pixel array of an imaging device (a horizontal direction). The second direction refers to an array direction of a pixel of a pixel column (a vertical direction).

In FIGS. 1 and 2, an imaging device package $10_A$ according to the first embodiment is a type in which a lens unit is attached using optical reference planes explained later as seating surfaces. A specific structure of the imaging device package $10_A$ according to the first embodiment is explained below.

An imaging device chip 11, which is an IC chip, is mounted on a substrate 12 with an imaging surface $11_A$ set on an upper side (a light capturing side). The imaging device chip 11 is electrically connected to a substrate bonding terminal (not shown) patterned in the substrate 12 by a bonding terminal 13A of a wire (a bonding wire/a gold wire) 13.

A supporting body 14 that supports an optical member explained later with respect to the substrate 12 is attached to a peripheral edge of the substrate 12. To attach the supporting body 14 to the peripheral edge of the substrate 12, for example, an adhesive is used. In this embodiment, the supporting body 14 is bonded to the substrate 12 with the wire 13 and the bonding terminal 13A of the wire 13 sealed by a bonding section 15 including the adhesive.

The bonding section 15 for bonding the supporting body 14 to the substrate 12 seals the wire 13 and the bonding terminal 13A of the wire 13. This means that the bonding section 15 is provided making use of a wire bonding area A. The wire bonding area A refers to an area necessary for electrically connecting the imaging device chip 11 and the bonding terminal on the substrate 12 with the wire 13.

The bonding section 15 is provided making use of the wire bonding area A. More specifically, as it is evident from FIGS. 1 and 2, the bonding section 15 is provided to include the wire bonding area A. Consequently, it is unnecessary to secure a bonding area B separately from the wire bonding area A. In this example, as it is evident from FIGS. 1 and 2, an area larger than the wire bonding area A is the bonding area B.

The supporting body 14 has a through-hole $14_A$ in the center thereof. The supporting body 14 supports, at a peripheral edge of the through-hole $14_A$, an optical member 16 having optical transparency such as seal glass with respect to the substrate 12. As shown in FIG. 1, the supporting body 14 includes attaching sections $17_A$ and $17_B$ for attaching a lens unit (not shown) at an end in a longitudinal direction thereof. The attaching sections $17_A$ and $17_B$ have attaching screw holes 18. Upper surfaces of the attaching sections $17_A$ and $17_B$ are used as optical reference planes 19.

The lens unit attached to the attaching sections $17_A$ and $17_B$ includes a lens for condensing incident light from a subject on the imaging surface $11_A$ of the imaging device chip 11 and a lens barrel for holding the lens. The lens unit is attached by screwing using the upper surfaces of the attaching sections $17_A$ and $17_B$, i.e., the optical reference planes 19 as seating surfaces, whereby the supporting body 14 supports the lens unit.

In the supporting body 14, a bottom surface (a bonding surface) corresponding to the bonding section 15 includes an uneven section 20. The uneven section 20 includes a projected section $20_A$ provided along the peripheral edge of the through-hole $14_A$, a recessed section $20_B$ provided on the outer side of the projected section $20_A$, and a projected section $20_C$ provided on the outer side of the recessed section $20_B$.

An end face of the projected section $20_C$ provided further on the outer side than the recessed section $20_B$, i.e., a boundary surface between the recessed section $20_B$ and the projected section $20_C$ is desirably an inclined surface. In particular, as explained concerning a method of manufacturing an imaging device package later, the uneven section 20 ($20_A$, $20_B$, and $20_C$) has an effective action when the supporting body 14 is bonded to the substrate 12 in the bonding section 15.

As explained above, when the supporting body 14 is attached to the substrate 12, the supporting body 14 is bonded to the substrate 12 with the wire 13 and the bonding terminal 13A of the wire 13 sealed by the bonding section 15. Therefore, first, it is possible to realize a reduction in the size of the imaging device package $10_A$.

Specifically, the bonding section 15 for bonding the supporting body 14 to the substrate 12 seals the wire 13 and the bonding terminal 13A of the wire 13 and the wire bonding area A is used as the bonding area B for the supporting body 14. This makes it unnecessary to separately secure the bonding area B. Therefore, it is possible to realize a reduction in the size of the imaging device package $10_A$.

For example, corrosion of the wire 13 can be suppressed and resistance to drop impact and washability of the wire 13 can be improved. Therefore, it is possible to improve the quality of the imaging device package $10_A$. Specifically, since the entire bonding terminal and the entire wire 13 around the imaging device chip (the IC chip) 11 are sealed by the bonding section 15, it is possible to prevent intrusion of moisture into the wire connecting section. Consequently, corrosion of the wire 13 and the connecting section of the wire 13 can be suppressed. Therefore, it is possible to realize further improvement of reliability (improvement of quality).

Figure 20:
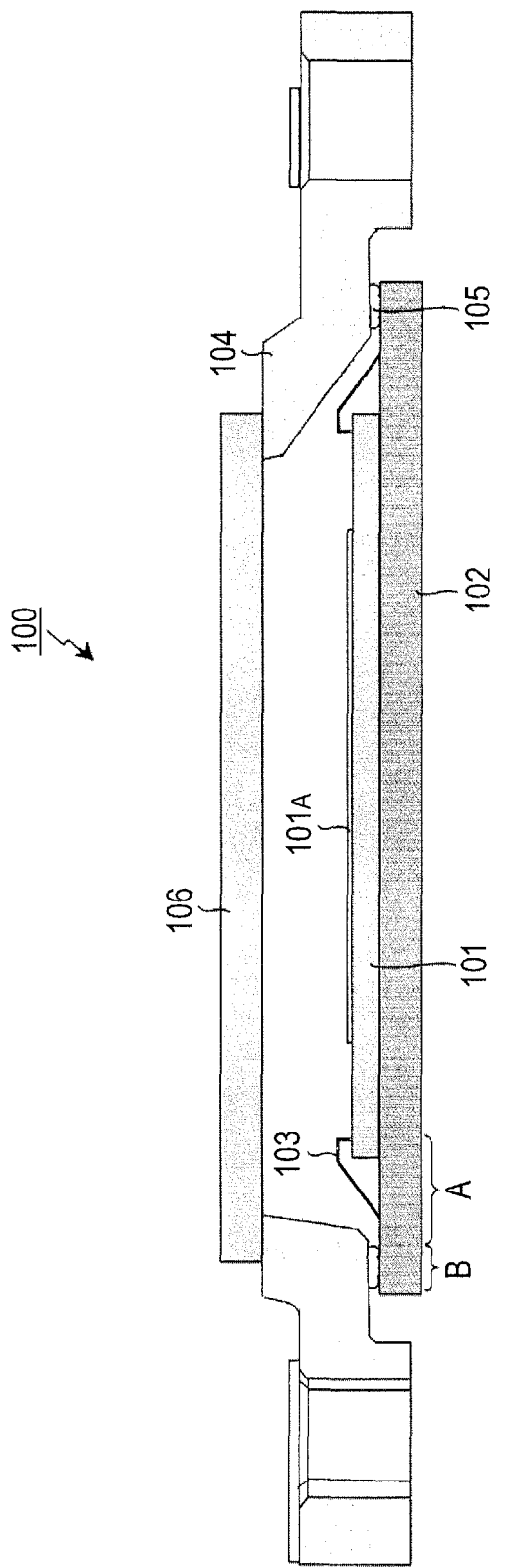
FIG. 20 is a sectional view served for explanation of an imaging device package according to a related art.

Further, compared with the structure in the past shown in FIG. 20, an area on the outer side of the imaging surface $11_A$ and a substrate area including the wire bonding area A can be used as the bonding area B for the supporting body 14. Therefore, a large bonding area can be secured. This is advantageous for adhesion. Bonding strength is increased and the imaging device package $10_A$ becomes robust against drop impact.

Because of the presence of the recessed section $20_B$, the thickness of the bonding section 15 can be set larger than that in the case of a flat surface. Therefore, the imaging device package $10_A$ becomes more robust against drop impact. Moreover, since the entire wire 13 and the entire connecting section of the wire 13 are sealed by the bonding section 15, even if impact due to drop or the like occurs, it is possible to suppress occurrence of a contact failure of the connecting section of the wire 13.

When the number of pixels is further increased, even presence of small dust leads to a failure of the imaging device package $10_A$. Therefore, in general, at a manufacturing stage of the imaging device package $10_A$, in order to remove impurities such as dust adhering to the imaging device package $10_A$ during an assembly process, a cleaning step is performed in a process after bonding of the supporting body 14 and before bonding of the optical component 16 (i.e., before sealing of the imaging device package $10_A$). In this dust cleaning step, in general, ultrasonic liquid immersion cleaning is performed.

In this ultrasonic liquid immersion cleaning, in the case of the structure in the past shown in FIG. 20, if an output of ultrasound is excessively increased, the ultrasound applies stress to the uncovered wire 103. There is concern that rupture of the wire 103 or a contact failure in the connecting section is caused. Therefore, cleaning conditions such as an ultrasound output may not be able to be freely adjusted.

On the other hand, in the case of the imaging device package $10_A$ according to this embodiment, the wire 13 is protected by the bonding section 15. With this structure, even if an output of ultrasound is excessively increased, the ultrasound does not directly apply stress to the wire 13. Therefore, the cleaning conditions such as an ultrasound output can be freely adjusted. The cleaning conditions can be maximized.

Modification of the First Embodiment

Figure 3:
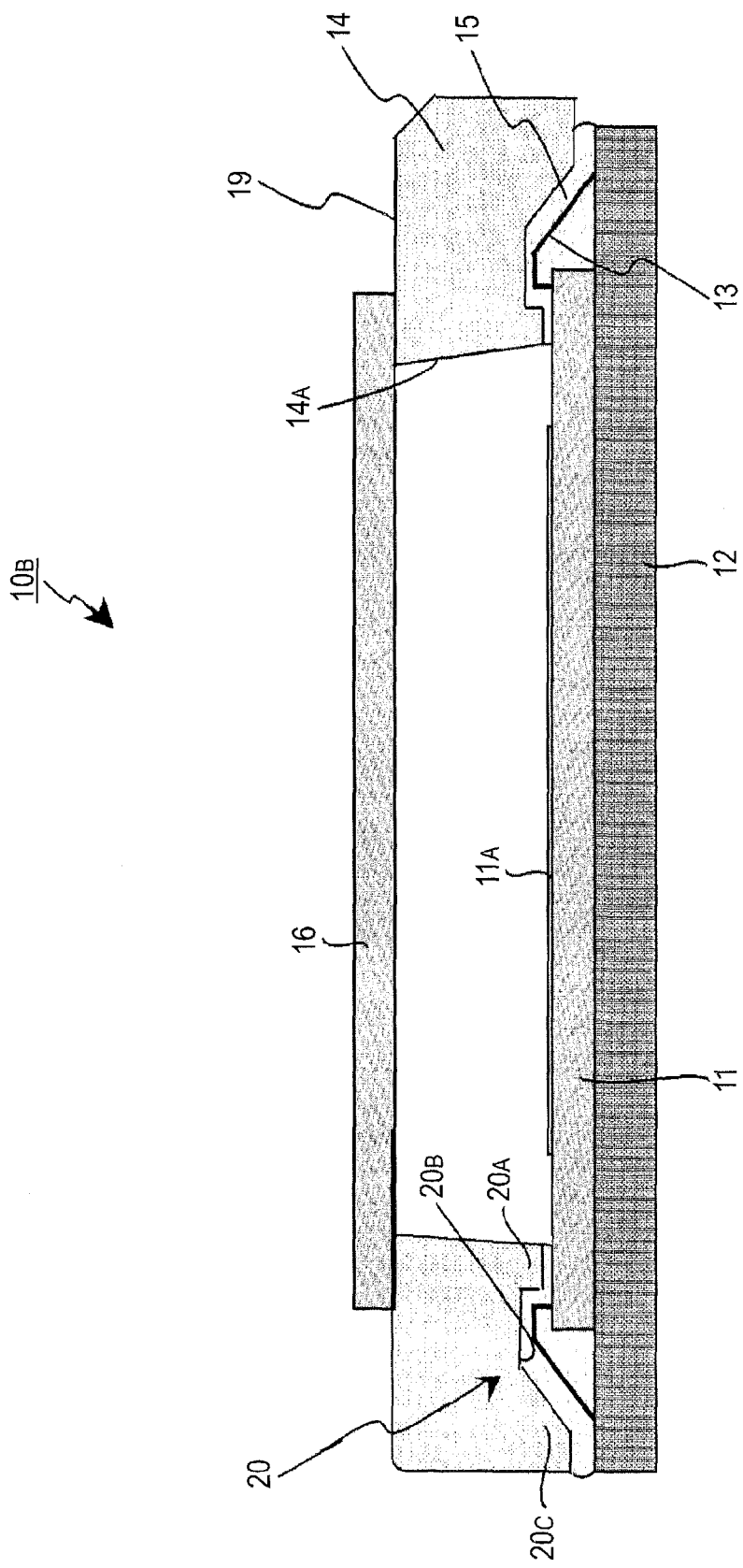
FIG. 3 is a sectional view showing a sectional structure along a first direction of an imaging device package according to a modification of the first embodiment.

The imaging device package $10_A$ according to the first embodiment is the type in which the upper surfaces of the attaching sections $17_A$ and $17_B$ are used as optical reference planes and the lens unit is attached using the optical reference planes as seating surfaces. On the other hand, as shown in FIG. 3, as in the first embodiment, the present disclosure can be applied to an imaging device package $10_B$ of a type in which the upper surface of the supporting body 14 is used as an optical reference plane and a lens unit is attached using the optical reference plane as a seating surface.

Specifically, in the imaging device package $10_B$ according to a modification of the first embodiment, as in the imaging device package $10_A$, the supporting body 14 is bonded to the substrate 12 with the wire 13 and the bonding terminal 13A of the wire 13 sealed by the bonding section 15. Therefore, it is possible to obtain actions and effects same as those in the first embodiment.

2. Second Embodiment

Figure 4:
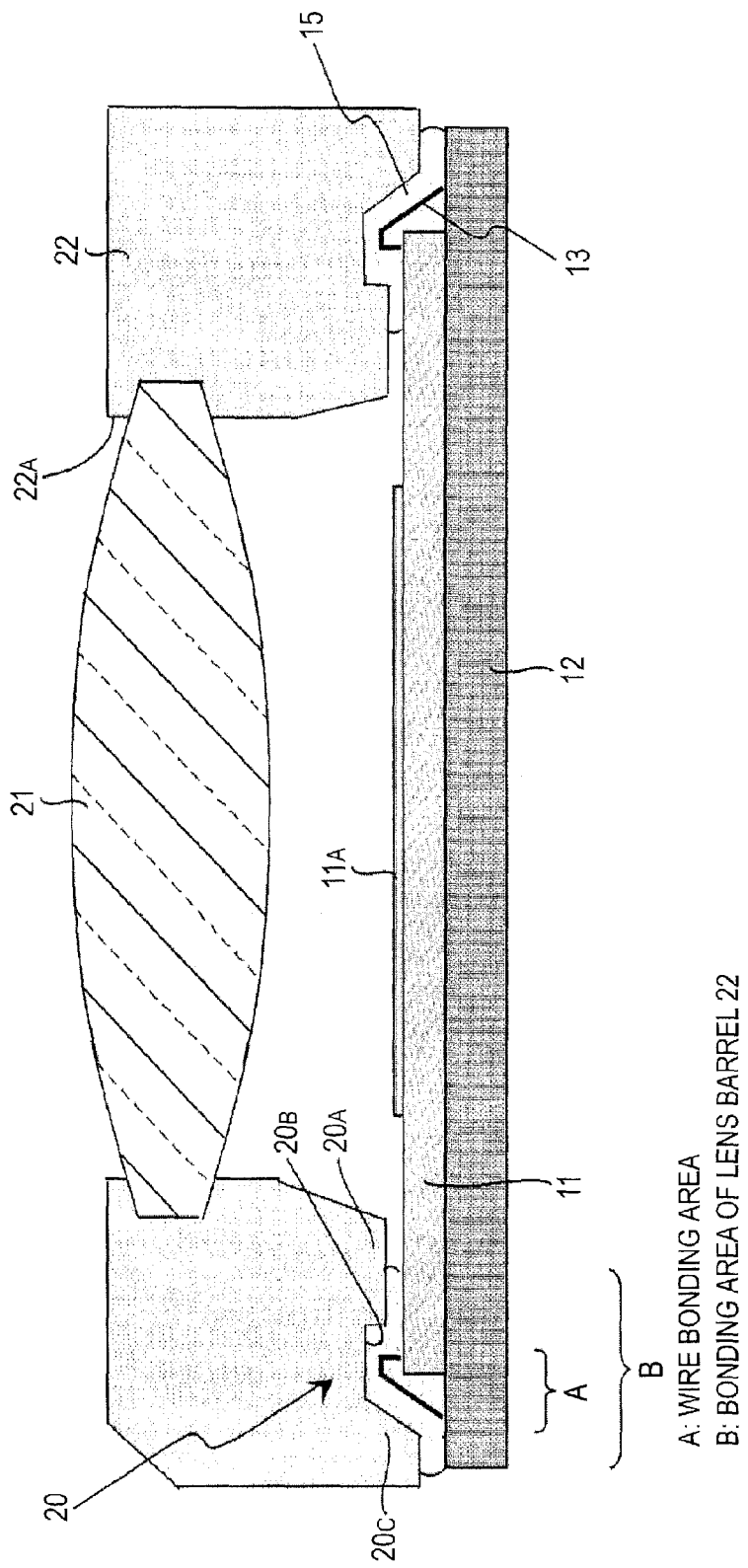
FIG. 4 is a sectional view showing a sectional structure along a first direction of an imaging device package according to a second embodiment of the present disclosure.

FIG. 4 is a sectional view showing a sectional structure along a first direction of an imaging device package according to a second embodiment of the present disclosure. In the figure, components equivalent to those shown in FIG. 1 are denoted by the same reference numerals and signs.

In FIG. 4, an imaging device package $10_C$ according to the second embodiment is a type in which a lens barrel 22 for holding a lens 21 for condensing incident light from a subject on the imaging surface $11_A$ of the imaging device chip 11 is directly mounted. A specific structure of the imaging device package $10_C$ according to the second embodiment is explained below.

The imaging device chip 11, which is an IC chip, is mounted on the substrate 12 with the imaging surface $11_A$ set on an upper side (a light capturing side). The imaging device chip 11 is electrically connected to a bonding terminal (not shown) formed in the substrate 12 by the wire (a bonding wire/a gold wire) 13.

The lens barrel 22 for holding the lens 21 with respect to the substrate 12 is attached to a peripheral edge of the substrate 12 as a supporting body that supports an optical member. To attach the lens barrel 22 to the peripheral edge of the substrate 12, for example, an adhesive is used. In this embodiment, the lens barrel 22 is bonded to the substrate 12 with the wire 13 and the bonding terminal 13A of the wire 13 sealed by the bonding section 15 including the adhesive.

As in the first embodiment, the bonding section 15 is provided making use of the wire bonding area A. More specifically, as it is evident from FIG. 4, the bonding section 15 is provided to include the wire bonding area A. Consequently, as in the first embodiment, it is unnecessary to secure the bonding area B separately from the wire bonding area A. In this example, as it is evident from FIG. 4, an area larger than the wire bonding area A is the bonding area B.

The lens barrel 22 has a through-hole $22_A$ in the center thereof. The lens barrel $22_A$ supports (holds), on the inner wall of the through-hole $22_A$, the lens 21 for condensing incident light from a subject on the imaging surface $11_A$ of the imaging device chip 11. In the lens barrel 22, a bottom surface (a bonding surface) corresponding to the bonding section 15 includes the uneven section 20. The uneven section includes the projected section $20_A$ provided along a peripheral edge of the through-hole $14_A$, the recessed section $20_B$ provided on the outer side of the projected section $20_A$, and the projected section $20_C$ provided on the outer side of the recessed section $20_B$.

An end face of the projected section $20_C$ provided further on the outer side than the recessed section $20_B$, i.e., a boundary surface between the recessed section $20_B$ and the projected section 20C is desirably an inclined surface. In particular, as explained concerning a method of manufacturing an imaging device package later, the uneven section 20 ($20_A$, $20_B$, and $20_C$) has an effective action when the lens barrel 22 is bonded to the substrate 12 in the bonding section 15.

As explained above, when the lens barrel 22 is attached to the substrate 12, the lens barrel 22 is bonded to the substrate 12 with the wire 13 and the bonding terminal 13A of the wire 13 sealed by the bonding section 15. Therefore, it is possible to obtain actions and effects same as those in the first embodiment.

Specifically, the bonding section 15 for bonding the lens barrel 22 to the substrate 12 seals the wire 13 and the bonding terminal 13A of the wire 13 and the wire bonding area A is used as the bonding area B for the supporting body 14. This makes it unnecessary to separately secure the bonding area B. Therefore, it is possible to realize a reduction in the size of the imaging device package $10_C$.

For example, corrosion of the wire 13 can be suppressed and resistance to drop impact and washability of the wire 13 can be improved. Therefore, it is possible to improve the quality of the imaging device package $10_C$. Specifically, since the entire bonding terminal and the entire wire 13 around the imaging device chip (the IC chip) 11 are sealed by the bonding section 15, it is possible to prevent intrusion of moisture into the wire connecting section. Consequently, corrosion of the wire 13 and the connecting section of the wire 13 can be suppressed. Therefore, it is possible to realize further improvement of reliability (improvement of quality).

Further, an area on the outer side of the imaging surface $11_A$ and a substrate area including the wire bonding area A can be used as the bonding area B for the supporting body 14. Therefore, a large bonding area can be secured. This is advantageous for adhesion. Bonding strength is increased and the imaging device package $10_C$ becomes robust against drop impact. Because of the presence of the recessed section $20_B$, the thickness of the bonding section 15 can be increased. Therefore, the imaging device package $10_A$ becomes more robust against drop impact. Moreover, since the entire wire 13 and the entire connecting section of the wire 13 are sealed by the bonding section 15, even if impact due to drop or the like occurs, it is possible to suppress occurrence of a contact failure of the connecting section of the wire 13.

Furthermore, in the imaging device package $10_C$ according to this embodiment, the wire 13 is protected by the bonding section 15. Therefore, even if an output of ultrasound is excessively increased in the ultrasonic liquid immersion cleaning, the ultrasound does not directly apply stress to the wire 13. Therefore, the cleaning conditions such as an ultrasound output can be freely adjusted. The cleaning conditions can be maximized.

3. Method of Manufacturing an Imaging Device Package

A method of manufacturing an imaging device package according to an embodiment of the present disclosure is explained. A method of manufacturing, for example, the imaging device package $10_A$ according to the first embodiment is explained with reference to FIG. 5.

As shown in FIG. 5, in a state in which the supporting body 14 is vertically reversed from that shown in FIG. 1 and fixed by inserting fixing pins 31A and 31B into the screw holes 18 of the supporting body 14, an adhesive, for example, thermosetting resin 32 is applied to the recessed section $20_B$ of the supporting body 14. Subsequently, the substrate 12 mounted with the imaging device chip 11 is lowered and placed on the supporting body 14 while the imaging surface $11_A$ and the supporting body 14 are aligned. The thermosetting resin 32 is heated from the rear surface side of the substrate 12 by a heater 33 via the substrate 12 to harden the resin 32.

[3-1. Concerning an Uneven Structure of the Supporting Body]

Actions and effects of an uneven structure of the supporting body 14 in the supporting body mounting process, i.e., the uneven section 20 of the supporting body 14 are explained.

First, attachment to the substrate 12 on a flat surface of the supporting body 14 not having the uneven section 20 is examined.

Figure 6A:
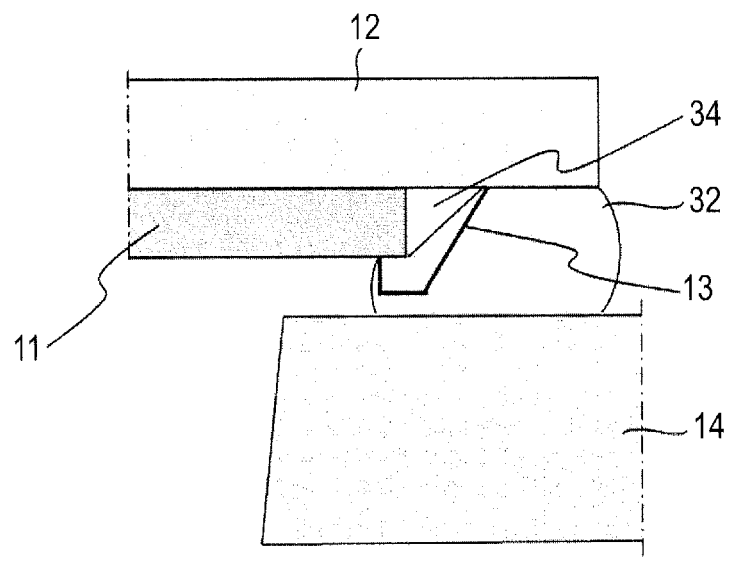
FIGS. 6A and 6B are explanatory diagrams concerning a state of an adhesive in a structure for attaching a supporting body to a substrate on a flat surface.
Figure 6B:
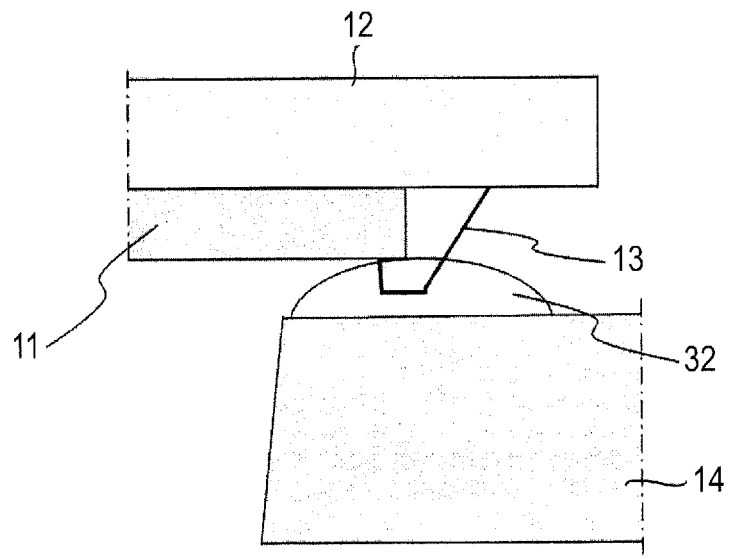

When the thermosetting resin 32 is applied on the flat surface of the supporting body 14 and then heated by the heater 33 via the substrate 12, as shown in FIG. 6A, the thermosetting resin 32 flows to the outer side of the wire 13 because of the flat surface. Consequently, a cavity tends to be formed at a corner between an end face of the imaging device chip 11 and the substrate 12. Even if the viscosity of the thermosetting resin 32 is reduced, as shown in FIG. 6B, the thermosetting resin 32 spreads over the flat surface and the wire 13 may not be able to be sealed.

In this way, when the supporting body 14 is bonded to the substrate 12 on the flat surface of the supporting body 14, the filling properties of the adhesive (the thermosetting resin 32) in the section of the wire 13 are deteriorated. When the filling properties of the adhesive are low, it is likely that a crack is formed starting from the cavity after moisture absorption reflow to cause peeling of the adhesive during drop impact and peeling of the connecting section of the wire 13.

On the other hand, in the supporting body 14 in the imaging device package $10_A$ according to the first embodiment, the bonding surface is formed as the uneven section 20. As explained above, as shown in FIG. 7A, the uneven section 20 includes the projected section (a protrusion) $20_A$ provided along the peripheral edge of the through-hole $14_A$, the recessed section $20_B$ provided on the outer side of the projected section $20_A$, and the projected section $20_C$ provided on the outer side of the recessed section $20_B$.

The end face of the projected section $20_C$ continuous to the recessed section $20_B$ and provided further on the outer side than the recessed section $20_B$, i.e., the boundary surface between the recessed section $20_B$ and the projected section $20_C$ is desirably an inclined surface $20_D$. The inclined surface $20_D$ is opposed to a descending section (an inclined section) of the wire 13.

In this way, the bonding surface of the supporting body 14 to the substrate 12 is formed as the uneven structure. Consequently, in a bonding step for bonding the supporting body 14 to the substrate 12 with the adhesive (the thermosetting resin) 32, the adhesive 32 can be pushed into the corner between the end face of the imaging device chip 11 and the substrate 12 under the wire 13.

Figure 7A:
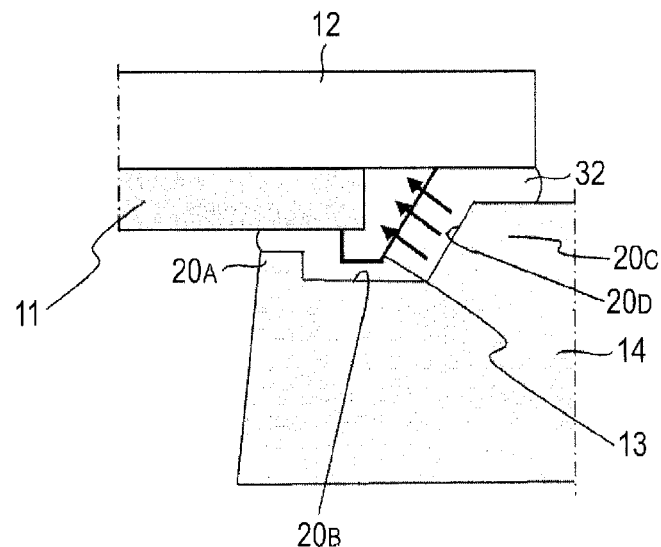
FIGS. 7A and 7B are explanatory diagrams concerning the structure of a bonding section of the supporting body and the substrate in the imaging device package according to the first embodiment.

In particular, when the boundary surface between the recessed section $20_B$ and the projected section $20_C$, i.e., a surface opposed to the descending section of the wire 13 is the inclined surface $20_D$, force in a direction indicated by an arrow in FIG. 7A acts on the adhesive 32. Therefore, the adhesive 32 can be more surely pushed into under the wire 13. Consequently, the filling properties of the adhesive 32 under the wire 13 can be improved. Therefore, it is possible to prevent a cavity from being formed at the corner between the end face of the imaging device chip 11 and the substrate 12.

Details of the uneven structure of the supporting body 14, i.e., the structure of the uneven section 20 provided on the bonding surface of the supporting body 14 are more specifically explained with reference to FIG. 7B. As it is evident from FIG. 7B, the imaging device chip 11 is joined to the substrate 12 by die paste (resin paste for die bond) 35.

Figure 7B:
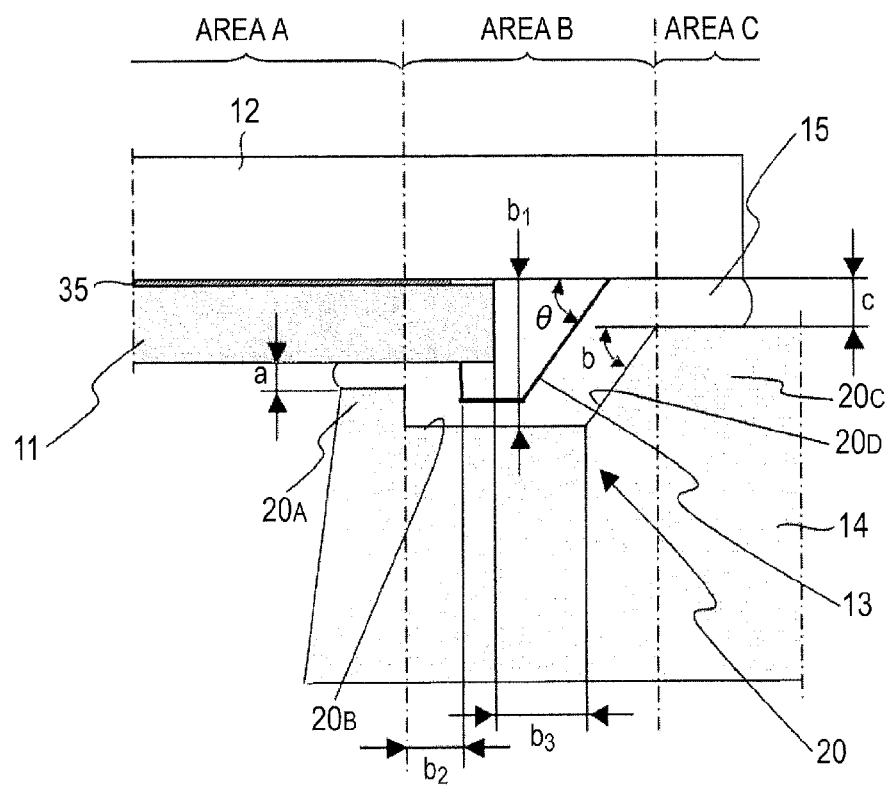

As shown in FIG. 7B, a peripheral section of the bonding section 15 (the adhesive 32) for bonding the supporting body 14 to the substrate 12 is divided into three areas A, B, and C. In the area A, in order to prevent the imaging surface $11_A$ of the imaging device chip 11 from being scratched, the imaging device chip 11 and the supporting body 14 desirably do not come into contact with each other.

In the area B, in order to prevent the wire 13 from being pushed down and short-circuited, the wire 13 and the supporting body 14 desirably do not come into contact with each other. Further, in the area B, in order to make it possible to more efficiently push the adhesive 32 into under the wire 13, an angle is desirably provided in the supporting body 14. The angle provided in the supporting body 14 is an angle of the inclined surface $20_D$ of the projected section $20_C$.

In the area C, in order to prevent six-axis adjustment from being affected, the substrate 12 and the supporting body 14 desirably do not come into contact with each other.

As an example, dimensions of regions for satisfying requirements of the areas A, B, and C are explained.

In FIG. 7B, a dimension between the surface of the imaging device chip 11 and the top surface of the projected section $20_A$ of the supporting body 14 in the area A is represented as a, a dimension between the surface of the substrate 12 and the bottom surface of the recessed section $20_B$ of the supporting body 14 in the area B is represented as $b_1$, and a dimension between the surface of the substrate 12 and the top surface of the projected section $20_C$ of the supporting body 14 in the area C is represented as c.

A dimension between the boundary surface between the projected section $20_A$ and the recessed section $20_B$ of the supporting body 14 and a rise on the imaging device chip 11 side of the wire 13 is represented as $b_2$ and a dimension between the end face of the imaging device chip 11 and a rise of the inclined surface $20_D$ of the supporting body 14 is represented as $b_3$. Further, a descending angle of the wire 13 (an angle of the descending section (the inclined section)) is represented as θ and an angle of the inclined surface $20_D$ of the supporting body 14 is represented as b.

The dimension a, the dimension $b_1$, the dimension $b_2$, the dimension $b_3$, the dimension c, the angle θ, and the angle b are set as described below.

The dimension a=six-axis adjustment fluctuation (in an imaging surface vertical direction)+dimension fluctuation of the supporting body 14

The dimension b1=the dimension a+maximum height from the imaging surface $11_A$ to the top of the wire 13

The dimensions $b_2$ and $b_3$=six-axis adjustment fluctuation (in an imaging surface horizontal direction)+dimension fluctuation of the supporting body 14

The angle b=the angle θ

The dimension c=the dimension a+thickness fluctuation of the die paste 35

By setting the dimensions and the angles to the numerical values described above, it is possible to design the uneven section 20 including the inclined surface $20_D$ having the angle b along the descending angle θ of the wire 13 without causing the supporting body 14 and the imaging device chip 11, the substrate 12, and the wire 13 to interfere with one another. It is possible to more surely push the adhesive 32 into under the wire 13 by setting the angle b of the inclined surface $20_D$ substantially the same as the descending angle θ of the wire 13.

[3-2. Concerning a Discharge Structure for Gas Entrapped During Bonding]

As explained above, the filling properties of the adhesive 32 under the wire 13 can be improved by the uneven structure of the supporting body 14. However, in some case, there is concern that gas entrapped (confined) when the adhesive 32 is filled under the wire 13 can escape to nowhere and remains as a void around the imaging device chip 11, i.e., at the corner between the end face of the imaging device chip 11 and the substrate 12.

In order to discharge gas entrapped in this bonding step (allow the gas to escape), two discharge structures 1 and 2 explained below are adopted.

(First Example of the Discharge Structure 1)

Figure 8:
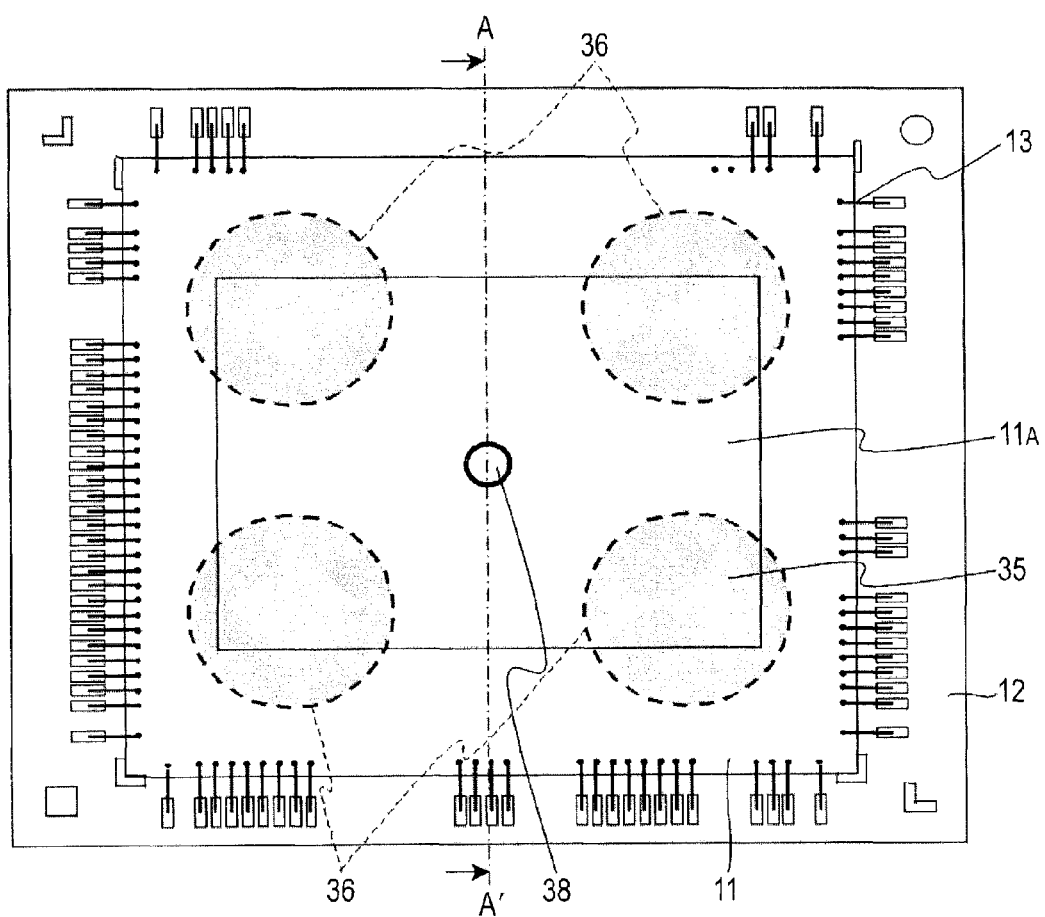
FIG. 8 is a plan view served for explanation of a first example of a discharge structure 1 and showing a plane structure of the imaging device package according to the first embodiment before the attachment of the supporting body.
Figure 9:
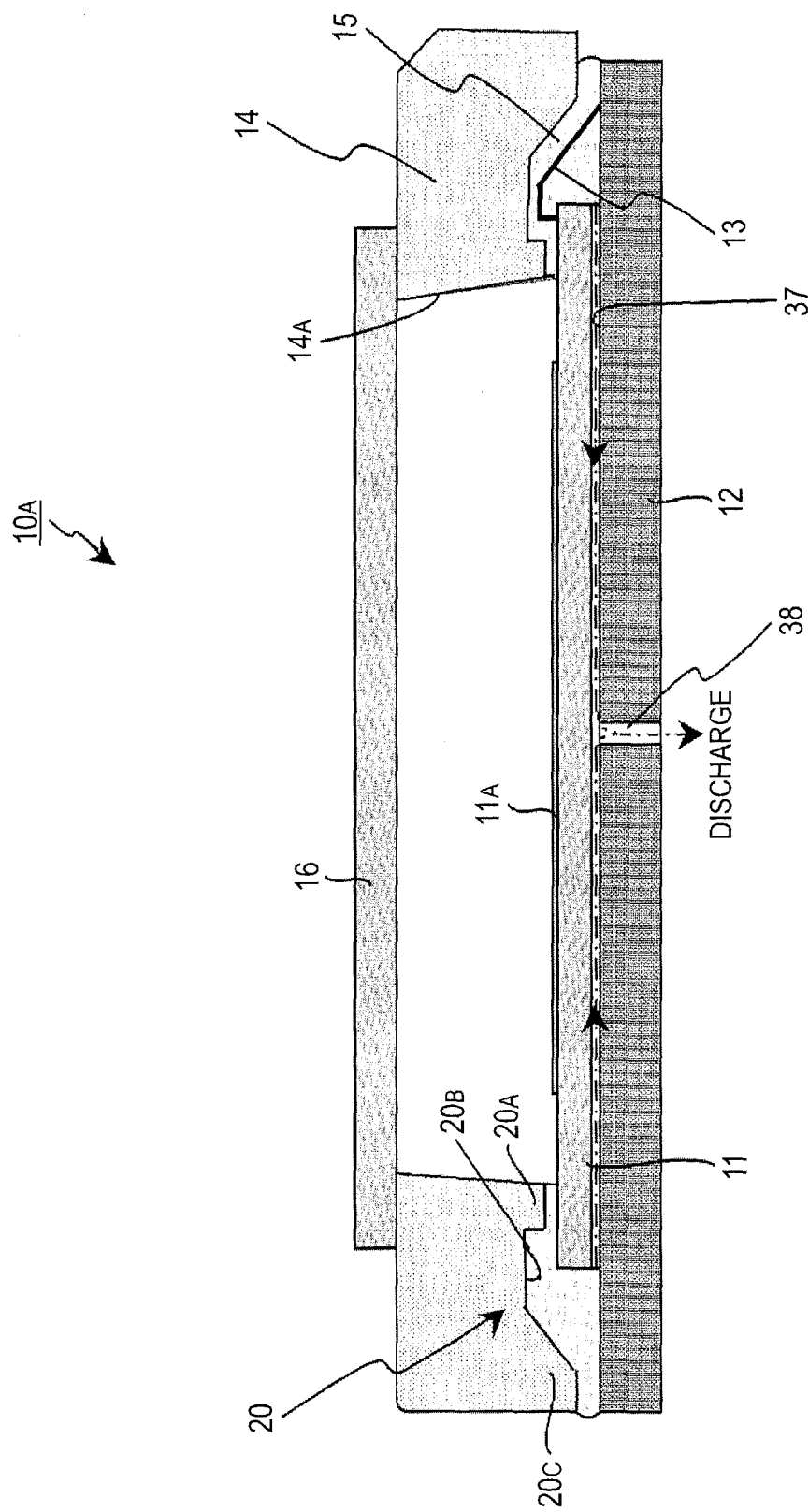
FIG. 9 is an arrow sectional view along line A-A' in FIG. 8 after the attachment of the supporting body.

FIG. 8 is a plan view served for explanation of a first example of the discharge structure 1 and showing a plane structure of the imaging device package $10_A$ according to the first embodiment before the attachment of the supporting body 14. FIG. 9 is an arrow sectional view along line A-A' in FIG. 8 after the attachment of the supporting body 14.

The imaging device chip 11 is fixedly attached to the substrate 12 by the die paste 35. At this point, in the case of the first example of the discharge structure 1, the imaging device chip 11 is joined (fixedly attached) in, for example, four places indicated by broken line circles in FIG. 8, specifically, die paste application areas 36 in four places corresponding to the vicinities of the four corners of the imaging surface (the pixel area) $11_A$ rather than over the entire surface of the imaging device chip 11.

Consequently, as it is evident from FIG. 9, a space (a cavity) 37 having height corresponding to the thickness of the die paste 35 is formed between the imaging device chip 11 and the substrate 12 excluding the die paste application areas 36 in the four places. More specifically, the space 37 is formed over areas in up down and left right directions including, in particular, the entire peripheral edge and the center of the imaging device chip 11. On the other hand, in the substrate 12, a vent hole 38 is drilled as a discharge section in an arbitrary position in an area where the space 37 is formed in, for example, a position corresponding to the substantial center of the imaging surface (the pixel area) $11_A$.

In this way, the space 37 is formed between the imaging device chip 11 and the substrate 12 and the vent hole 38 is drilled in the area of the space 37. Therefore, gas entrapped when the adhesive 32 is filled under the wire 13 in the bonding step can be discharged through the vent hole 38 using the space 37 as a channel. Consequently, since the entrapped gas is not left as a void around the imaging device chip 11, i.e., at the corner between the end face of the imaging device chip 11 and the substrate 12, it is possible to further improve the filling properties of the adhesive under the wire 13.

(Second Example of the Discharge Structure 1)

Figure 10:
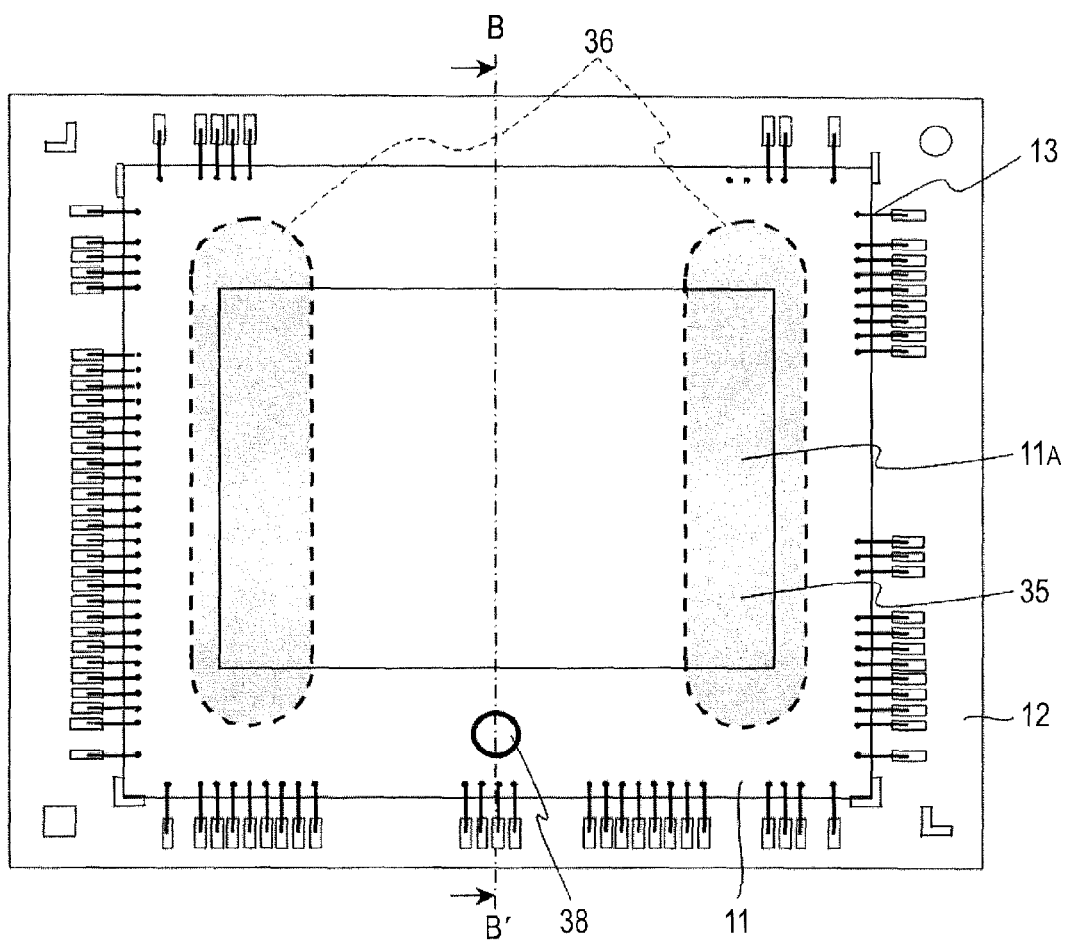
FIG. 10 is a plan view served for explanation of a second example of the discharge structure 1 and showing a plane structure of the imaging device package according to the first embodiment before the attachment of the supporting body.
Figure 11:
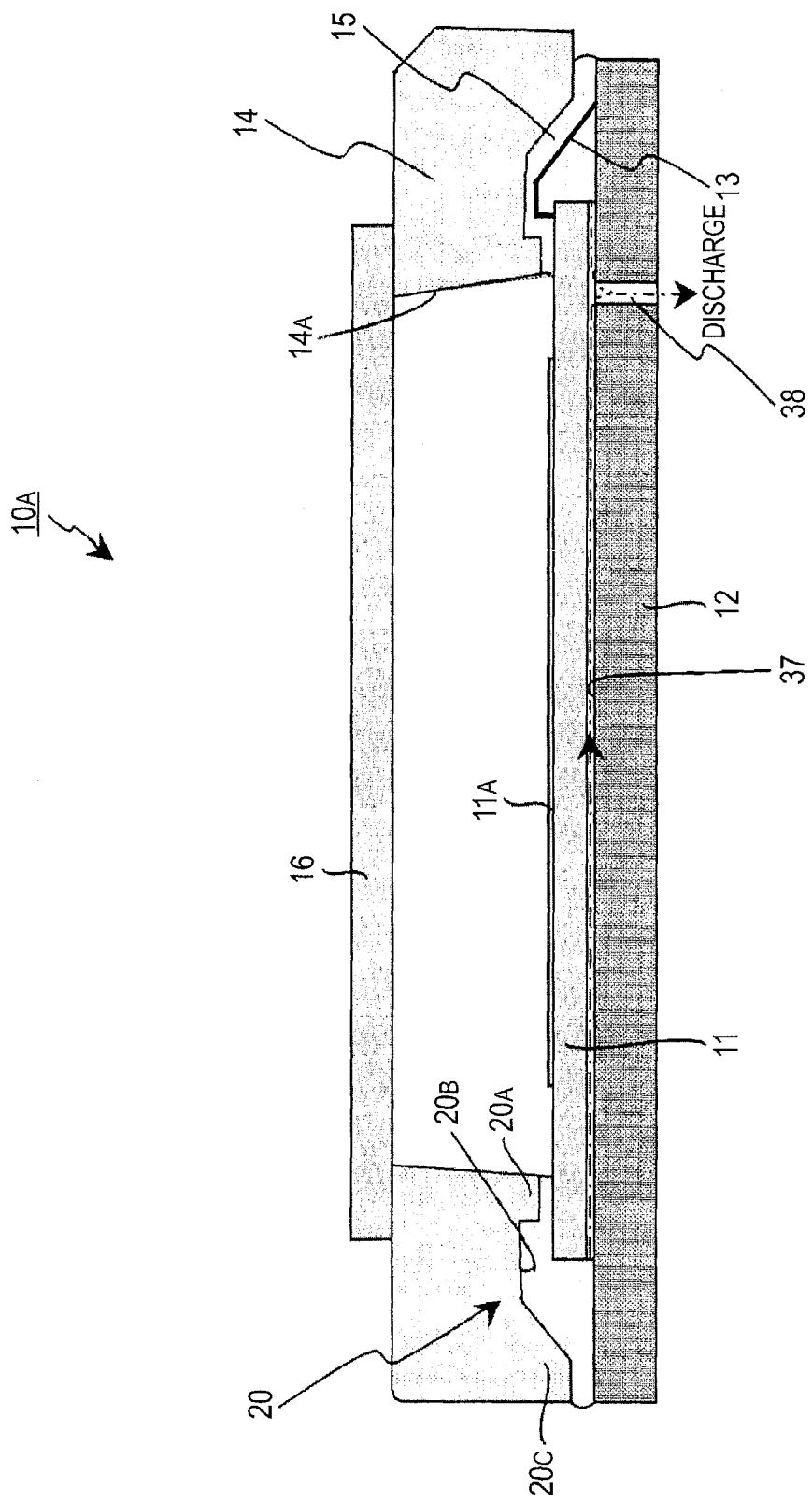
FIG. 11 is an arrow sectional view along line B-B' in FIG. 10 after the attachment of the supporting body.

FIG. 10 is a plan view served for explanation of a second example of the discharge structure 1 and showing a plane structure of the imaging device package $10_A$ according to the first embodiment before the attachment of the supporting body 14. FIG. 11 is an arrow sectional view along line B-B' after the attachment of the supporting body 14.

In the case of the second example of the discharge structure 1, the imaging device chip 11 is fixedly attached to the substrate 12 in, for example, the die paste application areas 36 in two places indicated by elongated ellipses of broken lines in FIG. 10 by the die paste 35 rather than over the entire surface of the imaging device chip 11. Specifically, the imaging device chip 11 is joined (fixedly attached) in the die paste application areas 36 in the two places corresponding to the vicinities at both ends in a longitudinal direction of the imaging surface (the pixel area) $11_A$.

Consequently, as it is evident from FIG. 11, the space 37 having the height corresponding to the thickness of the die paste 35 is formed between the imaging device chip 11 and the substrate 12 excluding the die paste application areas 36 in the two places. More specifically, the space 37 is formed over an entire area in the up down direction including, in particular, the entire peripheral edge and the center of the imaging device chip 11. On the other hand, in the substrate 12, the vent hole 38 is drilled in an arbitrary position in the area where the space 37 is formed, for example, a lower center position off the area of the imaging surface (the pixel area) $11_A$.

In this way, the space 37 is formed between the imaging device chip 11 and the substrate 12 and the vent hole 38 is drilled in the area of the space 37. Therefore, gas entrapped when the adhesive 32 is filled under the wire 13 in the bonding step can be discharged through the vent hole 38 using the space 37 as a channel. Consequently, actions and effects same as those in the case of the first example of the discharge structure 1 can be obtained. Specifically, since the gas entrapped in the bonding step is not left as a void around the imaging device chip 11, i.e., at the corner between the end face of the imaging device chip 11 and the substrate 12, it is possible to further improve the filling properties of the adhesive under the wire 13.

(First Example of the Discharge Structure 2)

Figure 12:
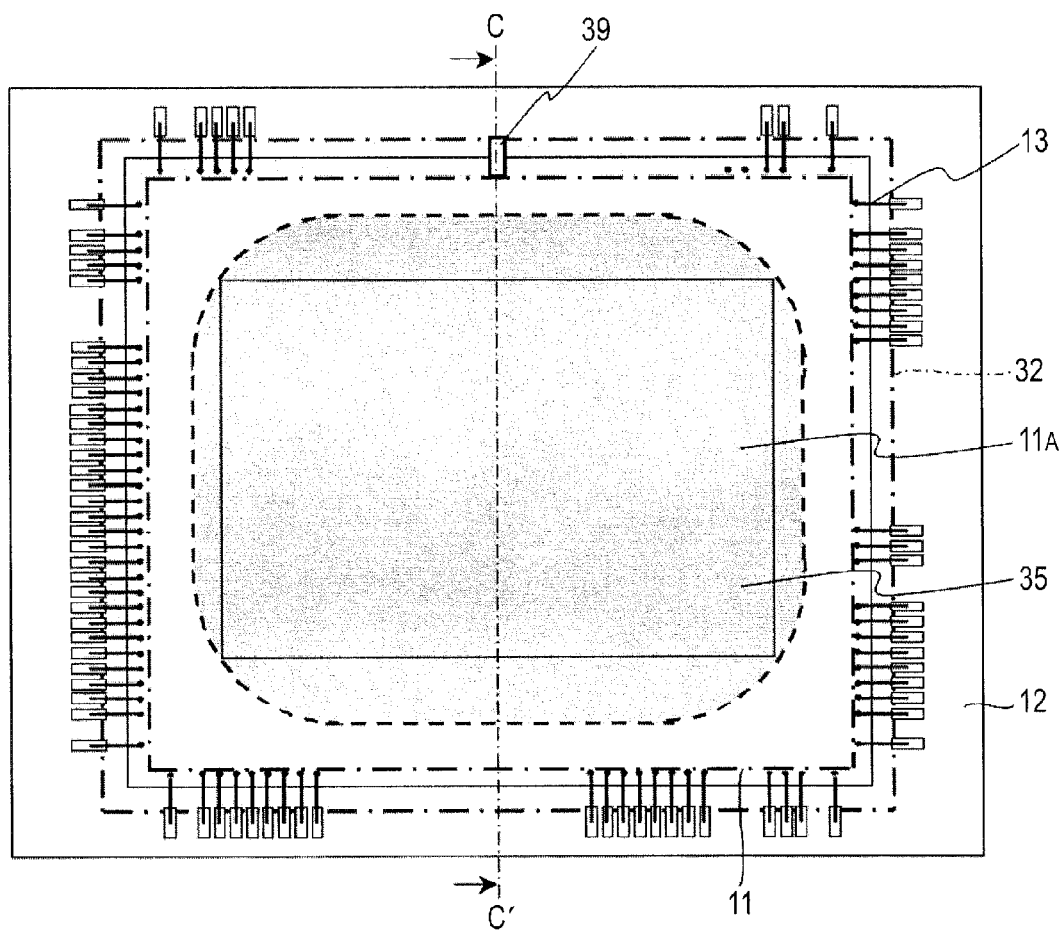
FIG. 12 is a plan view served for explanation of a first example of a discharge structure 2 and showing a plane structure of the imaging device package according to the first embodiment before the attachment of the supporting body.
Figure 13:
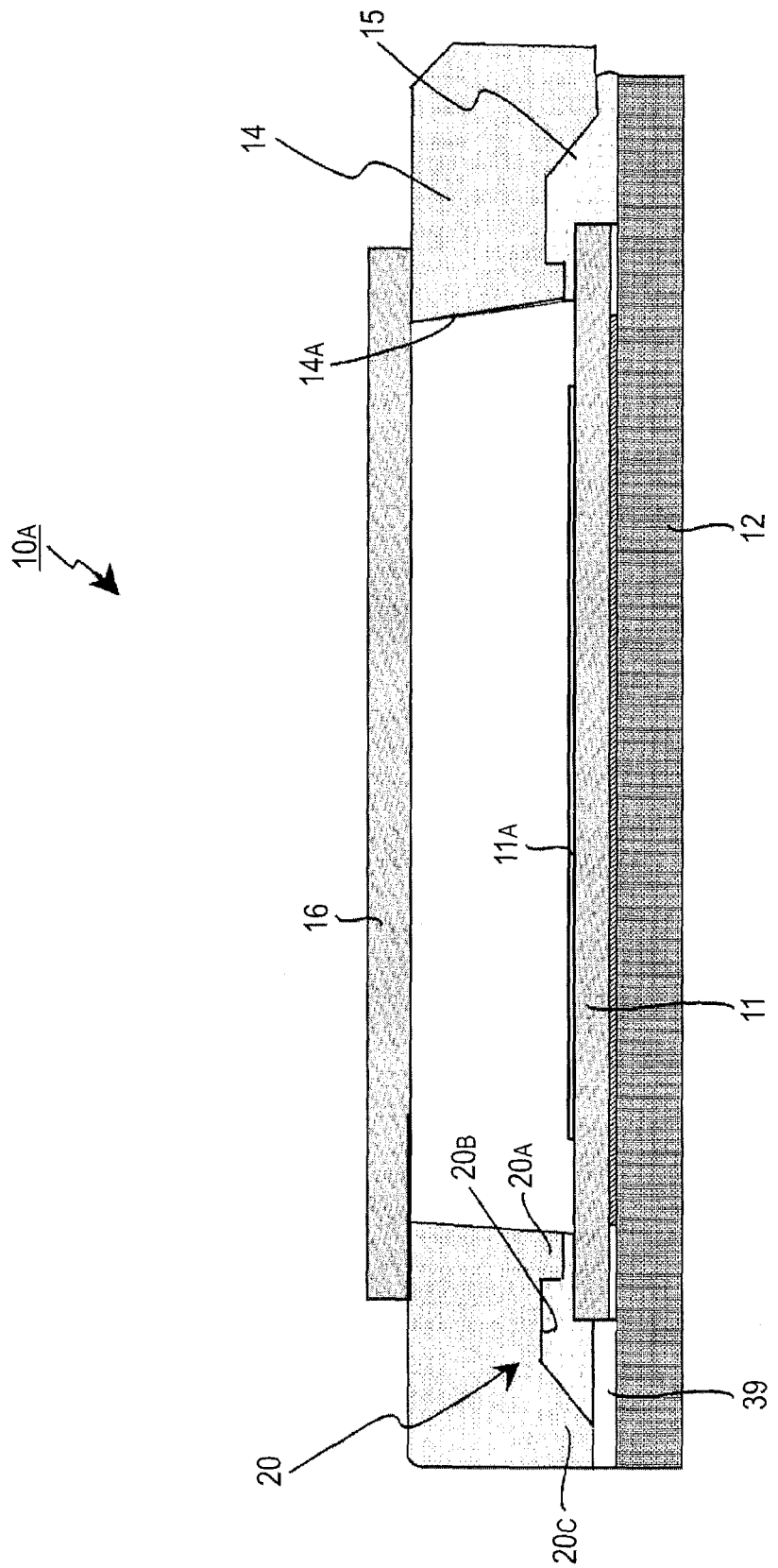
FIG. 13 is an arrow sectional view along line C-C' in FIG. 12 after the attachment of the supporting body.

FIG. 12 is a plan view served for explanation of a first example of the discharge structure 2 and showing a plane structure of the imaging device package $10_A$ according to the first embodiment before the attachment of the supporting body 14. FIG. 13 is an arrow sectional view along line C-C' in FIG. 12 after the attachment of the supporting body 14.

In the case of the first example of the discharge structure 2, the imaging device chip 11 is fixedly attached to the substrate 12 by the die paste 35 in the die paste application areas 36 having an area larger than the imaging surface (the pixel area) $11_A$ except at least the peripheral edge rather than over the entire surface of the imaging device chip 11. Consequently, as it is evident from FIG. 13, the space (the cavity) 37 having height corresponding to the thickness of the die paste 35 is formed in at least the peripheral edge of the imaging device chip 11 between the imaging device chip 11 and the substrate 12.

On the other hand, concerning the adhesive (the thermosetting resin) 32 applied to the bonding surface of the supporting body 14 in order to attach the supporting body 14 to the substrate 12, by contriving a method of applying the adhesive 32, a slit section 39 is formed as a discharge section in a part of the adhesive 32 applied in an annular shape. When the adhesive 32 is applied to the supporting body 14, as indicated by a dispersed point area surrounded by an alternate long and short dash line in FIG. 12, the adhesive 32 is applied in a rectangular annular shape at certain width along the peripheral edge of the imaging device chip 11 to slightly include the peripheral edge. A specific method of applying the adhesive 32 for forming the slit section 39 is explained later.

The slit section 39 is formed to be located in a region where the wire 13 is not present. In this example, the adhesive 32 is applied such that the slit section 39 is formed in a region above the imaging device chip 11. Even if the slit section 39 is formed in a part of the bonding section 15 (the adhesive 32) for bonding the substrate 12 and the supporting section 14, as it is evident from FIG. 13, since the adhesive 32 is interposed between the imaging device chip 11 and the supporting body 14, an airtight state is kept in a space on the imaging surface 11A.

Figure 14:
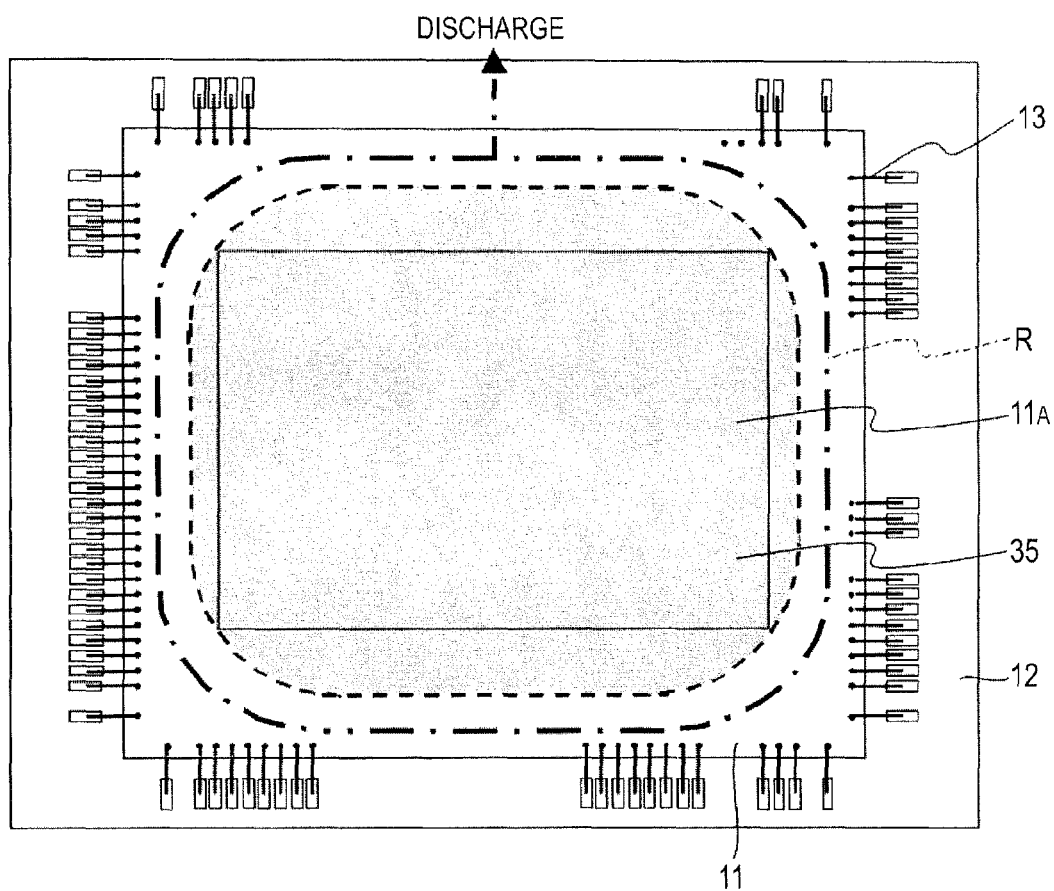
FIG. 14 is a diagram showing a channel for allowing gas entrapped when an adhesive is filled to escape in the first example of the discharge structure 2.

In this way, the space 37 is formed between the imaging device chip 11 and the substrate 12 and the slit section 39 is formed in a part of the adhesive 32 applied in an annular shape. Therefore, gas entrapped when the adhesive 32 is filled can be discharged through the slit section 39 using the space 37 as a channel. A channel R for allowing the gas entrapped when the adhesive 32 is filled to escape is indicated by a thick alternate long and short dash line in FIG. 14. Since the entrapped gas is discharged by the channel, the gas is not left as a void around the imaging device chip 11, i.e., at the corner between the end face of the imaging device chip 11 and the substrate 12. Therefore, it is possible to further improve the filling properties of the adhesive 32 under the wire 13.

(Second Example of the Discharge Structure 2)

Figure 15:
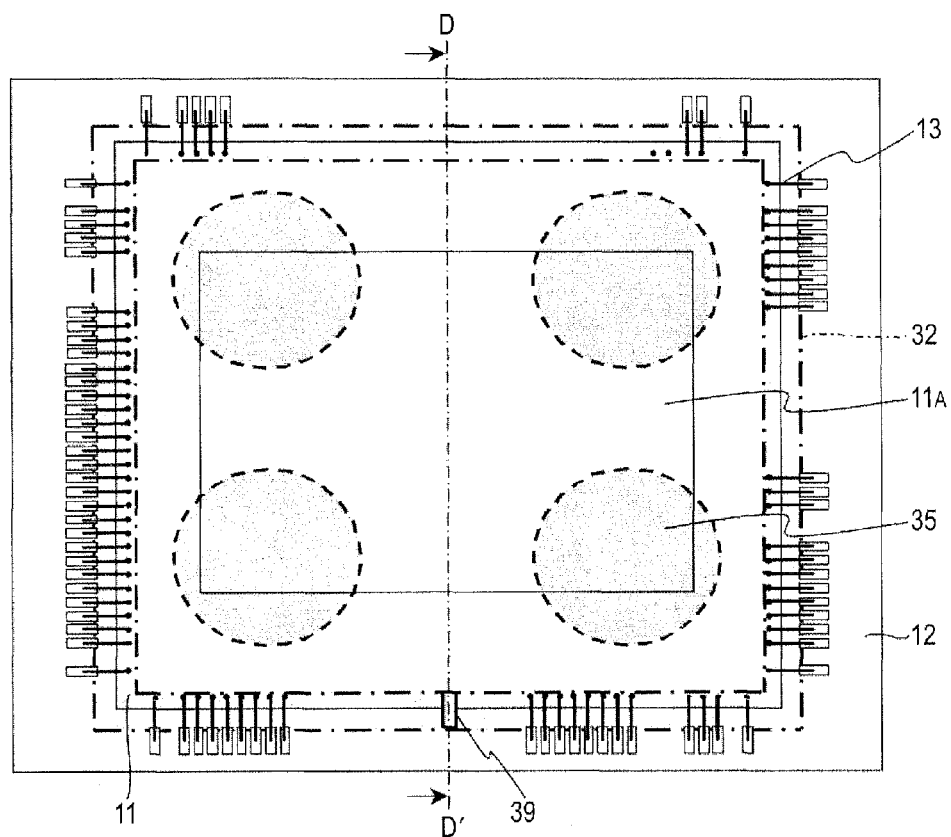
FIG. 15 is a plan view served for explanation of a second example of the discharge structure 2 and showing a plane structure of the imaging device package according to the first embodiment before the attachment of the supporting body.
Figure 16:
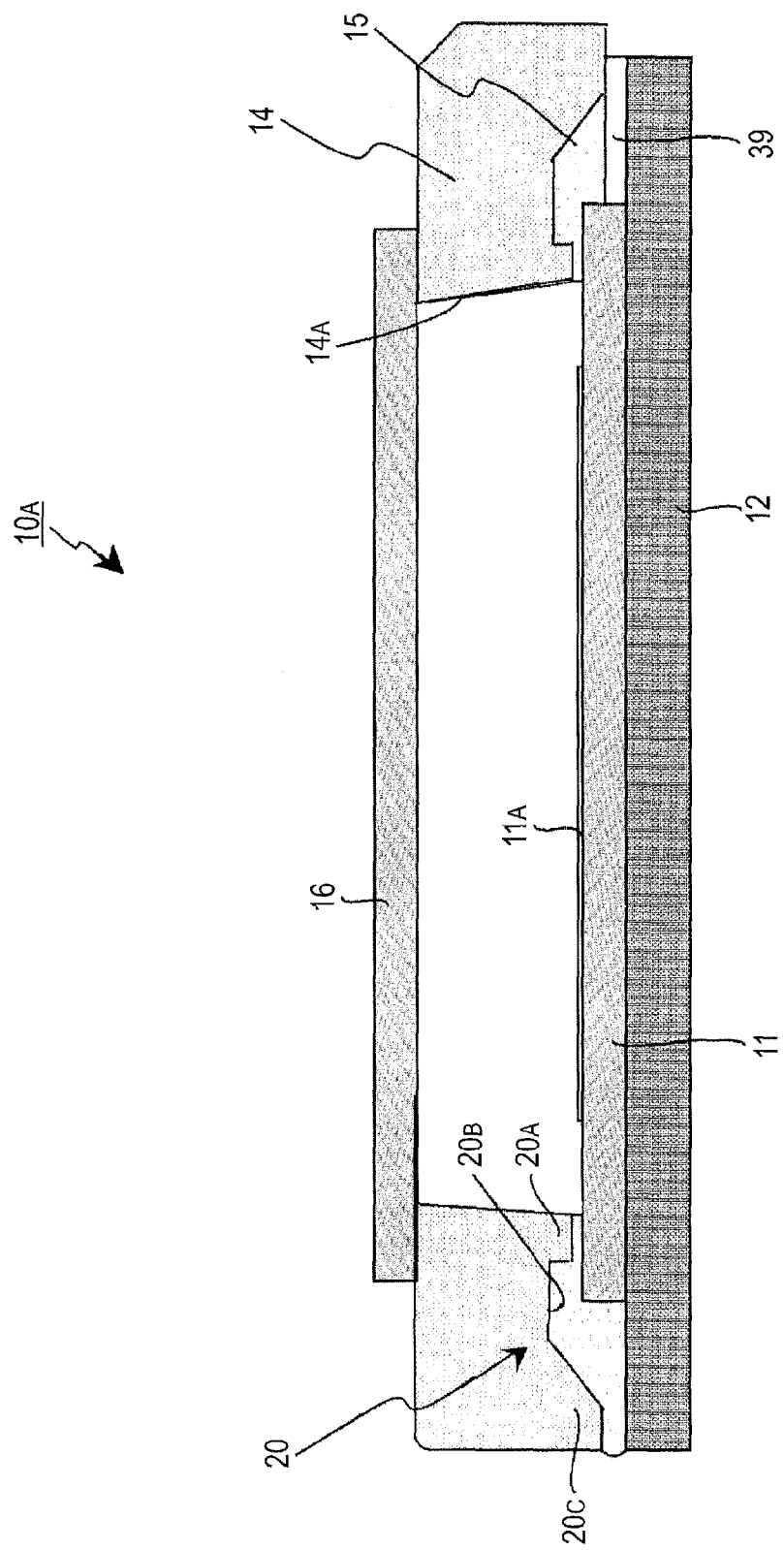
FIG. 16 is an arrow sectional view along line D-D' in FIG. 12 after the attachment of the supporting body.

FIG. 15 is a plan view served for explanation of a second example of the discharge structure 2 and showing a plane structure of the imaging device package $10_A$ according to the first embodiment before the attachment of the supporting body 14. FIG. 16 is an arrow sectional view along line D-D' in FIG. 15 after the attachment of the supporting body 14.

In the case of the second example of the discharge structure 2, as in the case of the first example of the discharge structure 1, the imaging device chip 11 is fixedly attached in, for example, four places indicated by broken line circles in FIG. 15, specifically, the die paste application areas 36 in four places corresponding to the vicinities of the four corners of the imaging surface (the pixel area) $11_A$. Consequently, as it is evident from FIG. 16, the space 37 having height corresponding to the thickness of the die paste 35 is formed between the imaging device chip 11 and the substrate 12 over areas in up down and left right directions including, in particular, the entire peripheral edge and the center of the imaging device chip 11.

Figure 17:
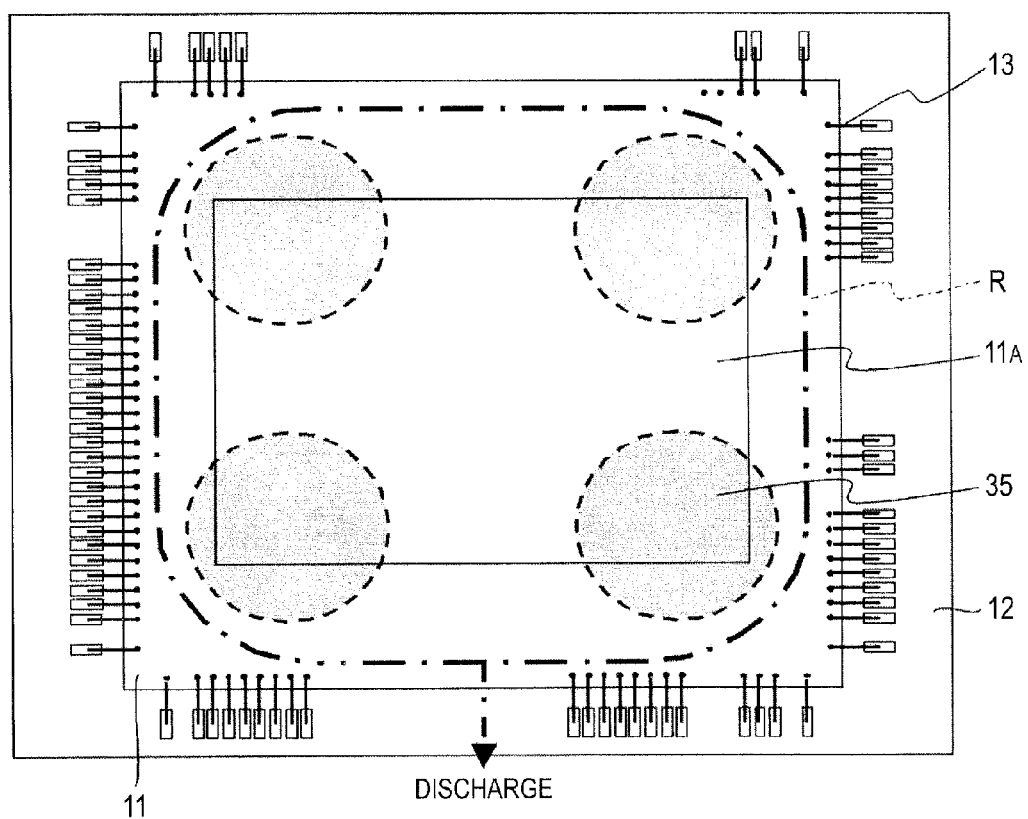
FIG. 17 is a diagram showing a channel for allowing gas entrapped when an adhesive is filled to escape in the second example of the discharge structure 2.

On the other hand, the slit section 39 formed in the bonding section 15 (the adhesive 32) for bonding the substrate 12 and the supporting body 14 is basically the same as that in the case of the first example. However, in this example, the adhesive 32 is applied such that the slit section 39 is formed in a region below the imaging device chip 11. As it is evident from a comparison of FIG. 12 and FIG. 15, in the case of the second example of the discharge structure 2, a large area of the space 37 can be secured compared with the case of the first example. Therefore, a large channel for allowing gas entrapped when the adhesive 32 is filled to escape can be secured. The channel R for allowing the gas entrapped when the adhesive 32 is filled to escape is indicated by a thick alternate long and short dash line in FIG. 17.

(Application Method for Forming the Slit Section)

A specific method of applying the adhesive 32 for forming the slit section 39 of the discharge structure 2 is explained. For the application of the adhesive 32, for example, an air dispense system is used. In this air dispense system, the adhesive 32, for example, thermosetting resin is applied while an ejection nozzle is moved in a rectangular shape.

As examples of the method of applying the adhesive 32 for forming the slit section 39, three methods explained below are conceivable.

Application method 1: when the adhesive 32 is applied in an annular shape, an application end position is shifted slightly away from an application start position to form the slit section 39 between the application start position and the application end position.

Application method 2: when the adhesive 32 is applied in an annular shape, application speed is increased in a specific position to form the slit section 39 in the position.

Application method 3: when the adhesive 32 is applied in an annular shape, ejection pressure from the ejection nozzle is reduced in a specific position to form the slit section 39 in the position.

The application method 1 is more specifically explained as an example. In the application method 1, as shown in FIG. 18A, when the ejection nozzle is moved in a rectangular shape with respect to the supporting body 14, application is started from a position X and ended slightly before the application start position X. Consequently, a very small gap is formed between the application start position and an application end position Y. This gap is the slit section 39.

Figure 18D:
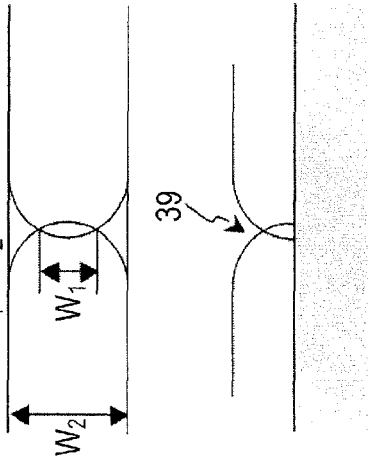
FIGS. 18A to 18D are explanatory diagrams concerning an example of a method of applying the adhesive for forming a slit section.
Figure 18A:
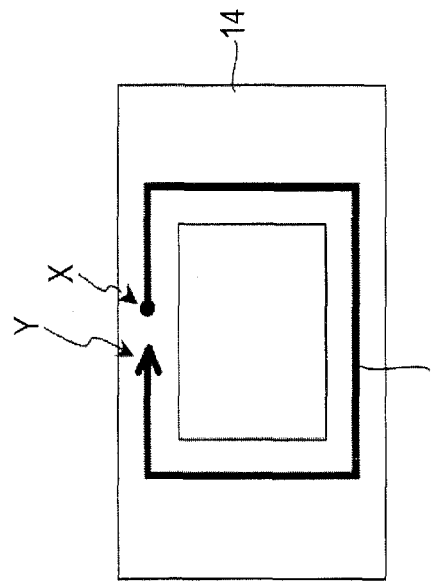
Figure 18C:
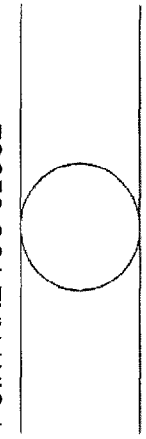
Figure 18B:
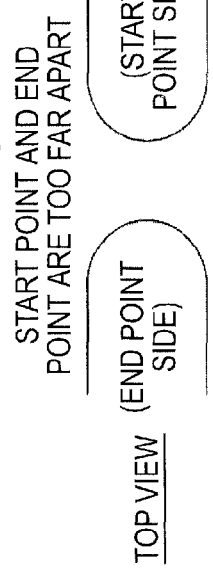

As shown in FIG. 18B, when the application start position X and the application end position Y are too far apart, a sectional area of the slit section 39 formed between a start point side and an end point side of the adhesive 32 is excessively large. Therefore, airtightness on the imaging surface $11_A$ is spoiled. Conversely as shown in FIG. 18C, when the application start position X and the application end position Y are too close, the slit section 39 is not formed and gas entrapped in the bonding step may not be able to be discharged. Therefore, a void is formed because of the gas.

As an optimum position of the application end position Y with respect to the application start position X, as shown in FIG. 18D, a state in which the start point side and the end point side of the adhesive 32 slightly overlap is desirable. Specifically, as width $w_1$ of an overlapping section of the start point side and the end point side of the adhesive 32, it is confirmed by an experiment that width about 0.3 to 0.8 times as large as normal application width $w_2$ under conditions of predetermined application speed and predetermined ejection pressure is desirable. In other word, when the slit section 39 is formed in this way, it is possible to surely discharge the gas entrapped when the adhesive 32 is filled while keeping the airtightness on the imaging surface $11_A$.

The method of manufacturing an imaging device package according to the embodiment of the present disclosure is explained above using the imaging device package $10_A$ according to the first embodiment as an example. However, basically, the same applies to the imaging device package $10_B$ according to the modification of the first embodiment and the imaging device package $10_C$ according to the second embodiment.

In the imaging device chip 11, an imaging device may be either a charge transfer imaging device represented by a CCD (Charge Coupled Device) type image sensor or an X-Y address type imaging device represented by a CMOS (Complementary Metal Oxide Semiconductor) type image sensor.

Further, the present disclosure is not limited to the application to an imaging device package and can also be applied to a module-like form having an imaging function in which an imaging section and a signal processing section or an optical system are collectively packaged, i.e., an imaging device module.

4. Electronic Apparatus

The imaging device package (the imaging device module) according to the embodiment of the present disclosure can be applied to all kinds of electronic apparatuses in which an imaging device is used for an image capturing section (a photoelectric conversion section) including imaging apparatuses such as a digital still camera and a video camera and portable terminal apparatuses having an imaging function such as a cellular phone.

Figure 19:
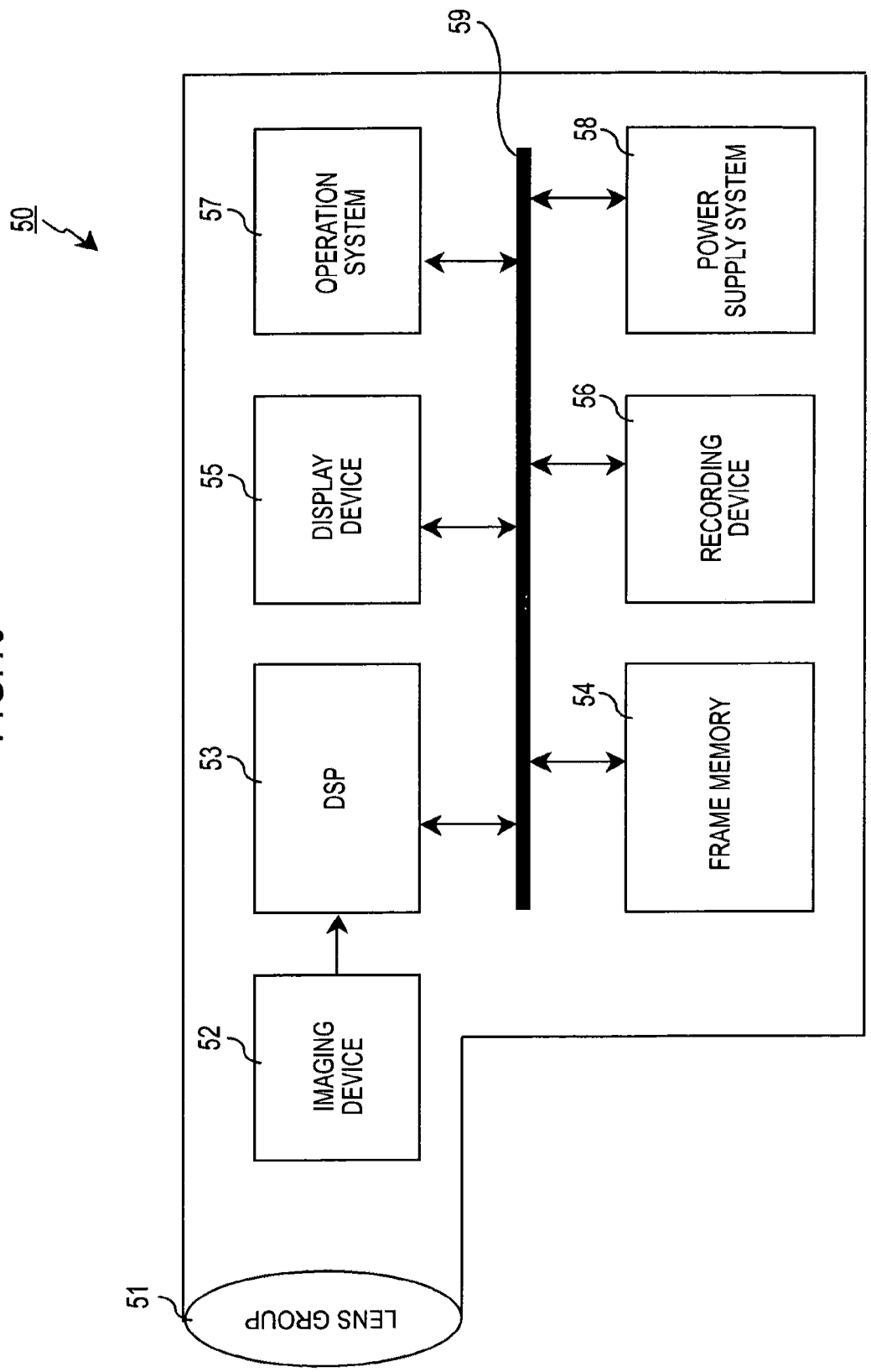
FIG. 19 is a block diagram showing a configuration example of a circuit system of an imaging apparatus that is an example of an electronic apparatus according to an embodiment of the present disclosure.

FIG. 19 is a block diagram showing an example of the configuration of a circuit system of an electronic apparatus according to an embodiment of the present disclosure, for example, an imaging apparatus such as a digital still camera or a video camera.

As shown in FIG. 19, an imaging apparatus 50 according to an embodiment of the present disclosure includes an optical system including a lens group 51, an imaging device 52, a DSP circuit 53, a frame memory 54, a display device 55, a recording device 56, an operation system 57, and a power supply system 58. The DSP circuit 53, the frame memory 54, the display device 55, the recording device 56, the operation system 57, and the power supply system 58 are connected to one another via a bus line 59.

The lens group 51 captures incident light (image light) from a subject and focuses the incident light on an imaging surface of the imaging device 52. The imaging device 52 converts a light amount of the incident light focused on the imaging surface by the lens group 51 into an electric signal in a pixel unit and outputs the light amount as a pixel signal.

The display device 55 includes a panel-type display device such as a liquid crystal display device or an organic EL (electro luminescence) display device and displays a moving image or a still image picked up by the imaging device 52. The recording device 56 records the moving image or the still image picked up by the imaging device 52 in a recording medium such as a video tape or a DVD (Digital Versatile Disk).

The operation system 57 issues operation commands concerning various functions of the imaging apparatus under operation by a user. The power supply system 58 appropriately supplies various power supplies serving as operation power supplies for the DSP circuit 53, the frame memory 54, the display device 55, the recording device 56, and the operation system 57 to these supply targets.

The imaging apparatus having the configuration explained above can be used as imaging apparatuses such as a video camera, a digital still camera, and a camera module for a mobile apparatus such as a cellular phone. In the imaging apparatus, when the imaging device package (or the imaging device module) according to the embodiments is used as the imaging device 52, actions and effects explained below can be obtained. The imaging device package according to the embodiments can realize a reduction in the size of a package and improvement of reliability (improvement of quality) of a wire connecting section. Therefore, it is possible to realize a reduction is the size of an imaging apparatus (electronic apparatus) body and improvement of quality.

The present disclosure contains subject matter related to that disclosed in Japanese Priority Patent Application JP 2010-241821 filed in the Japan Patent Office on Oct. 28, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device package comprising:
   an imaging device chip;
   a substrate on which the imaging device chip is mounted;
   a wire that electrically connects the imaging device chip and the substrate at a peripheral edge of the substrate around the imaging device chip;
   a supporting body that supports an optical member with respect to the substrate; and
   a bonding section that bonds the supporting body to the substrate while sealing and completely enveloping the wire and a bonding terminal of the wire at the peripheral edge of the substrate.

2. An imaging device package comprising:
   an imaging device chip;
   a substrate on which the imaging device chip is mounted;
   a wire that electrically connects the imaging device chip and the substrate at a peripheral edge of the substrate around the imaging device chip;
   a supporting body that supports an optical member with respect to the substrate; and
   a bonding section that bonds the supporting body to the substrate while sealing the wire and a bonding terminal of the wire at the peripheral edge of the substrate,
   wherein, in the supporting body, a bonding surface bonded to the substrate by the bonding section includes an uneven section.

3. The imaging device package according to claim 2, wherein, in the uneven section, a boundary surface between a recessed section and a projected section, which is a surface opposed to a descending section of the wire, is an inclined surface.

4. The imaging device package according to claim 3, wherein an angle of the inclined surface is substantially equal to a descending angle of the wire.

5. An imaging device package comprising:
an imaging device chip;
a substrate on which the imaging device chip is mounted;
a wire that electrically connects the imaging device chip and the substrate at a peripheral edge of the substrate around the imaging device chip;
a supporting body that supports an optical member with respect to the substrate;
a bonding section that bonds the supporting body to the substrate while sealing the wire and a bonding terminal of the wire at the peripheral edge of the substrate; and
a discharge section that discharges, when the supporting body is bonded to the substrate by the bonding section, gas confined among the bonding section, the supporting body, and the substrate.

6. The imaging device package according to claim 5, wherein
the imaging device chip is partially joined to the substrate and a space is formed between the imaging device chip excluding a joined section and the substrate, and
the discharge section includes a vent hole formed in the substrate and discharges the gas confined among the bonding section, the supporting body, and the substrate through the space and the vent hole.

7. The imaging device package according to claim 5, wherein
the imaging device chip is joined to the substrate such that a space is formed between the imaging device chip and the substrate at least in a peripheral edge of the imaging device chip,
the bonding section includes an adhesive applied to the supporting body in an annular shape along the peripheral edge of the imaging device chip, and
the discharge section includes a slit section formed in a part of the adhesive applied in the annular shape and discharges the gas confined among the bonding section, the supporting body, and the substrate through the space and the slit section.

8. The imaging device package according to claim 7, wherein, when the adhesive is applied in the annular shape, the slit section is formed between an application start position and an application end position by shifting the application end position away from the application start position.

9. The imaging device package according to claim 7, wherein, when the adhesive is applied in the annular shape, the slit section is formed in a specific position by increasing application speed in the specific position.

10. The imaging device package according to claim 7, wherein the slit section is formed in a specific position by reducing ejection pressure from an ejection nozzle in the specific position.

11. A method of manufacturing an imaging device package including
an imaging device chip,
a substrate on which the imaging device chip is mounted;
a wire that electrically connects the imaging device chip and the substrate at a peripheral edge of the substrate around the imaging device chip, and
a supporting body that supports an optical member with respect to the substrate, the method comprising:
bonding the supporting body to the substrate while sealing and completely enveloping the wire and a bonding terminal of the wire at the peripheral edge of the substrate.

12. An electronic apparatus comprising
an imaging device package including:
an imaging device chip;
a substrate on which the imaging device chip is mounted;
a wire that electrically connects the imaging device chip and the substrate at a peripheral edge of the substrate around the imaging device chip;
a supporting body that supports an optical member with respect to the substrate; and
a bonding section that bonds the supporting body to the substrate while sealing and completely enveloping the wire and a bonding terminal of the wire at the peripheral edge of the substrate.

* * * * *